United States Patent
Zietz

(10) Patent No.: US 10,191,092 B2
(45) Date of Patent: Jan. 29, 2019

(54) TIME DOMAIN MEASURING METHOD WITH CALIBRATION IN THE FREQUENCY RANGE

(71) Applicant: ROSENBERGER HOCHFREQUENZTECHNIK GMBH & CO. KG, Fridolfing (DE)

(72) Inventor: Christian Zietz, Lippstadt (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 112 days.

(21) Appl. No.: 15/116,428

(22) PCT Filed: Dec. 18, 2014

(86) PCT No.: PCT/EP2014/003424
§ 371 (c)(1),
(2) Date: Aug. 3, 2016

(87) PCT Pub. No.: WO2015/117634
PCT Pub. Date: Aug. 13, 2015

(65) Prior Publication Data
US 2017/0074911 A1    Mar. 16, 2017

(30) Foreign Application Priority Data

Feb. 6, 2014  (DE) ...................... 10 2014 001 585

(51) Int. Cl.
*G01R 19/25* (2006.01)
*G01R 35/00* (2006.01)
*G01R 27/32* (2006.01)

(52) U.S. Cl.
CPC ......... *G01R 19/2509* (2013.01); *G01R 27/32* (2013.01); *G01R 35/005* (2013.01)

(58) Field of Classification Search
CPC ... G01R 19/2509; G01R 27/32; G01R 35/005
(Continued)

(56) References Cited

U.S. PATENT DOCUMENTS

| 9,823,281 | B2 * | 11/2017 | Armbrecht | ........... G01R 35/005 |
| 2008/0048674 | A1 | 2/2008 | Tan et al. | |
| 2012/0109566 | A1 * | 5/2012 | Adamian | ............... G01R 27/28 |
| | | | | 702/107 |

FOREIGN PATENT DOCUMENTS

| CN | 100471187 C | 3/2009 |
| CN | 101441232 A | 5/2009 |

(Continued)

OTHER PUBLICATIONS

Arkadiuz Lewandowski et al.: "Covariance-Based Vector-Network-Analyzer Uncertainty Analysis for Time and Frequency-Domain Measurements", IEEE Transactions on Microwave Theory and Techniques, vol. 58, No. 7, Jul. 1, 2010, pp. 1877-1886.

(Continued)

*Primary Examiner* — John H Le
(74) *Attorney, Agent, or Firm* — Robert Curcio; DeLio, Peterson & Curcio, LLC

(57) ABSTRACT

A method for determining an electric voltage u(t) and/or an electric current i(t) of an HF signal in an electrical cable on a calibration plane by measuring in the time domain. Using a directional coupler, a first portion $v_3(t)$ of a first HF signal is decoupled, fed to a time domain measuring device, and a second portion $v_4(t)$ of a second HF signal is decoupled. The signal portions $v_3(t)$, $v_4(t)$ are converted into the frequency domain, then absolute wave frequencies in the frequency domain are determined and converted into the electric voltage u(t) and/or the electric current i(t). In a previous calibration step, the calibration parameters are determined, and the absolute wave frequencies on the calibration plane are determined using the calibration parameters ($e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$), wherein $\Gamma_3$, $\Gamma_4$ are the reflection factors of the inputs of the time domain measuring device.

6 Claims, 6 Drawing Sheets

(58) Field of Classification Search
USPC .............................. 702/64, 75, 107; 324/601
See application file for complete search history.

(56) References Cited

FOREIGN PATENT DOCUMENTS

| JP | H07-151803 A   | 6/1995  |
|----|----------------|---------|
| JP | 2001-272428 A  | 10/2001 |
| JP | 2007-285890 A  | 11/2007 |
| JP | 2009-068932 A  | 4/2009  |
| TW | 201403082 A    | 1/2014  |
| WO | 2013/048791 A2 | 6/2003  |
| WO | 2003048791 A2  | 6/2003  |
| WO | 2008016699 A2  | 2/2008  |
| WO | 2013143650 A1  | 10/2013 |

OTHER PUBLICATIONS

Clement T.S. et al.: "Calibration of Sampling Oscilloscopes with High-Speed Photodiodes", IEEE Transaction on Microwave Theory and Techniques, vol. 54, No. 8, Aug. 1, 2006, pp. 3173-3181.
Gillon R. et al.: The application of large-signal calibration techniques yields unprecedented insight during TLP and ESD testing. In: EOS/ESD Symposium, 2009, S. 1-7. ISBN 1-58537-176-9.
Root, D. et al.: X-Parameter: The new paradigm for the description of nonlinear RF and microwave devices. In: tm-Technisches Messen, 2010, No. 7-8, vol. 77.
Scott, J.B. et al.: A new instrument architecture for millimeter-wave time-domain signal analysis. In: ARFTG 63rd Conference, 2004, S. 47-52. ISBN 0-7803-8371-0.
Siart, U.: Calibration of network analyzers. As of Jan. 4, 2012, Version 1.51. URL: http://www.siart.de/lehre/nwa.pdf [clicked on May 9, 2014].

* cited by examiner

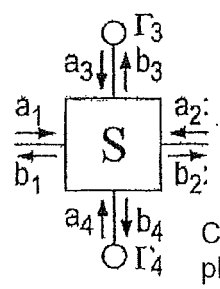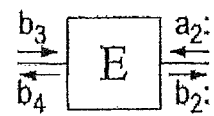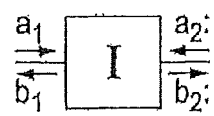
Calibration plate
Fig. 4a
Calibration plate
Fig. 4b
Calibration plate
Fig. 4c
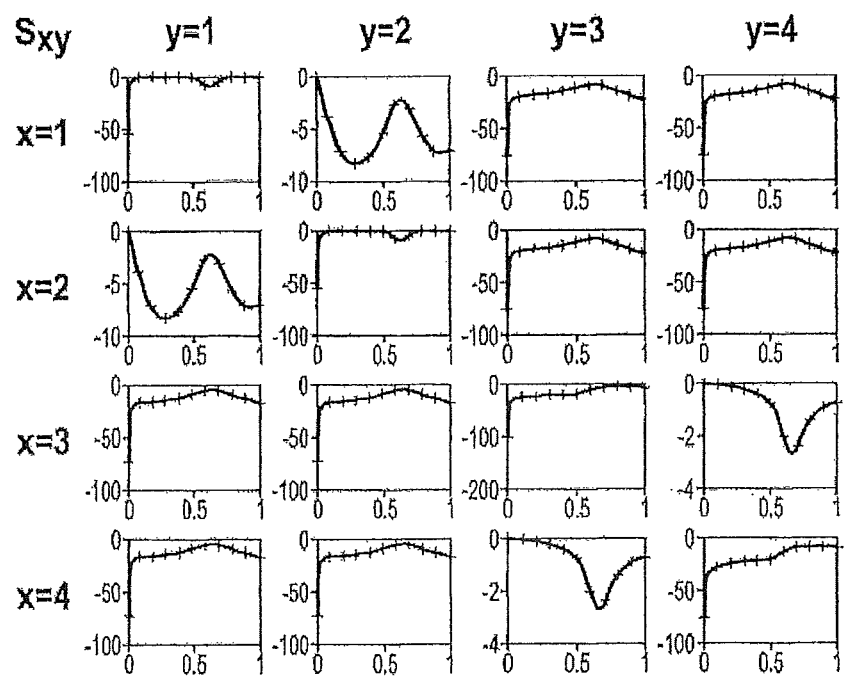
Fig. 5

TIME DOMAIN MEASURING METHOD WITH CALIBRATION IN THE FREQUENCY RANGE

BACKGROUND OF THE INVENTION

1. Field of the Invention

The invention relates to a method for determining an electric voltage u(t) and/or an electric current i(t) of a RF signal on an electric cable in a calibration plane through measurement in the time domain using a time domain measuring device, whereby the calibration plane is designed such that a device under test can be connected electrically with the calibration plane. In a measuring step, using a directional coupler, a first component $v_3(t)$ of a first RF signal which, starting out from a signal input, runs in the direction of the calibration plane through the directional coupler, is decoupled, fed to the time domain measuring device at a first measuring input and measured there in a first measuring plane, and a second component $v_4(t)$ of a second RF signal which, starting out from the calibration plane, runs in the direction of the signal input through the directional coupler, is also decoupled using the directional coupler, fed to the time domain measuring device at a second measuring input and measured there in a second measuring plane. The signal components $v_3(t)$, $v_4(t)$ measured using the time domain measuring device are, by means of a first mathematical operation, transformed into the frequency domain as wave quantities $V_3(f)$ and $V_4(f)$, then absolute wave quantities $a_2$ and $b_2$ in the frequency domain are determined in the calibration plane from the wave quantities $V_3(f)$ and $V_4(f)$ using calibration parameters, and finally the calculated absolute wave quantities $a_2$ and $b_2$ are, by means of a second mathematical operation, converted into the electric voltage u(t) and/or the electric current i(t) of the RF signal in the time domain in the calibration plane. In a preceding calibration step, the calibration parameters are determined in such a way that they link the wave quantities $V_3(f)$ and $V_4(f)$ in the measuring planes mathematically with the wave quantities $a_2$ and $b_2$ in the calibration plane.

2. Description of Related Art

One of the most important measuring tasks in radio frequency and microwave technology involves the measurement of reflection coefficients or generally—in the case of multiports—the measurement of scattering parameters. The linearly-describable network behavior of a device under test (DUT) is characterized through the scattering parameters. Frequently, it is not only the scattering parameters at a single measuring frequency which are of interest, but their frequency-dependency over a finitely broad measuring bandwidth. The associated measuring method is referred to as network analysis. Depending on the importance of the phase information in the measuring task in question, the scattering parameters can either be measured solely in terms of amount or also as a complex measurement. In the first case one speaks of scalar network analysis, in the second case of vectorial network analysis. Depending on the method, number of ports and measuring frequency range, the network analyzer is a more or less complex system consisting of test signal source and receivers which function according to the homodyne or the heterodyne principle. Because the measuring signals have to be fed to the device under test and back again through cables and other components with unknown and non-ideal properties, in addition to random errors, system errors also occur in network analysis. Through calibration measurements, the aim of which is to determine as many as possible of the unknown parameters of the test apparatus, the system errors can, within certain limits, be reversed. Very many methods and strategies exist here which differ considerably in the scope of the error model and thus in complexity and efficiency. (Uwe Siart; "Calibration of Network Analysers"; 4 Jan. 2012 (Version 1.51); http://www.siart.de/lehre/nwa.pdf).

However, scattering parameters measured in such a calibrated manner only fully describe linear, time-invariant devices under test. The X parameters represent an expansion of the scattering parameters to non-linear devices under test (D. Root, et al: "X-Parameters: The new paradigm for describing non-linear RF and microwave components." In: tm—Technisches Messen No. 7-8, Vol. 77, 2010), which are also defined through the frequency. However, each device under test can also be described through measurement of the currents and voltages or the absolute wave quantities at its ports within the time domain. The measurement in the time domain inherently includes all spectral components resulting for example from the non-linearity as well as the change over time of the device under test or its input signals. Such a time domain measurement also requires calibration. However, in order to measure absolute values the aforementioned calibration methods cannot be applied without modification, since they only permit the determination of relative values (scattering parameters).

A high frequency circuit analyzer which is used to test amplifier circuits is known from WO2003/048791 A2. A microwave transition analyzer (MTA) with two inputs measures two independent signal waveforms, for example the propagated and reflected wave, via signal paths and ports in the time domain while the amplifier circuit under test is connected. The measured waves are further processed by means of calibration data in order to compensate for the influence of the measurement system on the waves between the ports of the amplifier circuit and the input ports of the MTA. The MTA is again used in order to determine the calibration data, measuring signals in the time domain while the calibration standards are connected. These signals in the time domain are converted into the frequency domain using an FFT and the calibration data are then determined. Since only periodic signals in the time domain are measured, the signals are converted to a lower-frequency intermediate frequency prior to measurement.

The document WO2013/143650 A1 describes a time domain measuring method with calibration in the frequency domain according to the preamble of claim 1. In this method, an electric voltage and/or an electric current of a high frequency signal are measured in the time domain on an electric conductor in a calibration plane. For this purpose, a directional coupler is inserted in the line supplying the measurement signal to the device under test, and a first component of the first HF signal, which runs from the signal input of the directional coupler through the directional coupler in the direction of the device under test, is decoupled via the first measuring output of the directional coupler and measured using the time domain measuring device, and a second component of the HF signal returning from the device under test, which runs in the opposite direction through the directional coupler, is decoupled via the second measuring output of the directional coupler and measured using the time domain measuring device. The measured signal components are transformed into the frequency domain in order to obtain wave quantities. With the aid of previously determined calibration parameters, corresponding wave quantities in the calibration plane are determined in the frequency domain from these wave quantities determined in the measuring planes, and these wave quantities are then in turn transformed back into the time domain, so that they state the signal values u(t) and/or i(t) in the time domain which are to be determined in the calibration plane.

The calibration parameters which link the wave quantities in the measuring planes with the wave quantities in the calibration plane are, in a preceding calibration step, determined in a frequency-dependent manner with the aid of a calibration device, whereby the calibration step is described in detail in the cited document WO2013/143650 A1. These calibration parameters can be represented in the form of an error matrix $$E = \begin{pmatrix} e_{00} & e_{01} \\ e_{10} & e_{11} \end{pmatrix}$$

with which the wave quantities $a_2$, $b_2$ in the calibration plane can be calculated as follows from wave quantities $b_4$, $b_3$ in the measuring planes:

$$\begin{pmatrix} b_4 \\ b_2 \end{pmatrix} = \begin{pmatrix} e_{00} & e_{01} \\ e_{10} & e_{11} \end{pmatrix} \begin{pmatrix} b_3 \\ a_2 \end{pmatrix}.$$

The disclosing content of WO2013/143650 A1 is, with respect to the determination of the calibration parameters, herewith included in this description through express reference.

However, it has transpired that the signal values in the calibration plane determined by means of this method are not always exact and can depend on the time domain measuring device used.

Known from WO-A-2013 143 650 is a method for determining an electric voltage and/or an electric current of an RF signal on an electric conductor in a calibration plane through measurement in the time domain using a time domain measuring device, wherein a device under test can be connected electrically with the calibration plane. In a measuring step, using a directional coupler, a first component of a first RF signal which, starting out from a signal input, runs in the direction of the calibration plane through the directional coupler, is decoupled, fed to the time domain measuring device at a first measuring input and measured there. A second component of a second RF signal which, starting out from the calibration plane, runs in the direction of the signal input through the directional coupler, is fed to the time domain measuring device at a second measuring input and measured there. The signal components are, by means of a first mathematical operation, transformed into the frequency domain as wave quantities, then from these wave quantities absolute wave quantities in the frequency domain are determined in the calibration plane using calibration parameters, and finally the determined absolute wave quantities are, by means of a second mathematical operation, converted into the electric voltage and/or the electric current of the RF signal in the time domain in the calibration plane, wherein the calibration parameters link the wave quantities mathematically with the absolute wave quantities in the calibration plane.

The document Clement T. S. et al: "Calibration of Sampling Oscilloscopes With High-Speed Photodiodes," IEEE TRANSACTIONS ON MICROWAVE THEORY AND TECHNIQUES, IEEE SERVICE CENTER, PISCATAWAY, N.J., US, vol. 54, no. 8, 1 Aug. 2006 (2006-08-01), pages 3173-3181, XP-001545193, ISSN: 0018-9480, DOI: 10.1109/TMTT.2006.879135 section: C. Impedance Mismatch Correction discloses the determination of reflection coefficients of a photodiode and an oscilloscope with the aid of a network analyzer.

The document Arkadiusz Lewandowski et al: "Covariance-Based Vector-Network-Analyzer Uncertainty Analysis for Time and Frequency-Domain Measurements", IEEE TRANSACTIONS ON MICROWAVE THEORY AND TECHNIQUES, IEEE SERVICE CENTER, PISCATAWAY, N.J., US, vol. 58, no. 7, 1 Jul. 2010 (2010-07-01), pages 1877-1886, XP-011311287, ISSN: 0018-9480, section: IV. Propagating Covariance-Matrix-Based Uncertainties subsection; A Mismatched-Correcting Waveform Measurements discloses the determination of an output impedance of the signal source and an input impedance of the oscilloscope using a network analyser, whereby the equation used is only valid for low frequencies, but not for high frequencies.

The document WO-A-2008 016699 discloses the determination of various parameters for various components such as test prods or cables.

SUMMARY OF THE INVENTION

In view of this problem, the invention is based on the problem of providing an improved measuring method for high frequency currents and voltages and absolute wave quantities in the time domain.

This problem is solved according to the invention through a further development of the method described above, which is substantially characterized in that the first measuring input of the time domain measuring device has a known (complex-valued) reflection coefficient $\Gamma_3 \neq 0$ and/or the second measuring input of the time domain measuring device has a known (complex-valued) reflection coefficient $\Gamma_4 \neq 0$, wherein, in the calibration step, the calibration parameters $e_{00,r}$, $e_{01,r}$, $e_{10,r}$, $e_{11,r}$ are determined with the aid of a calibration device in relation to the frequency f and in relation to the reflection coefficient at at least one of the measuring inputs of the time domain measuring device, and in the measuring step the wave quantities $a_2$ and $b_2$ are determined from the wave quantities $V_3(f)$ and $V_4(f)$ using the calibration parameters $e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$.

The above and other objects, which will be apparent to those skilled in the art, are achieved in the present invention which is directed to a method for determining an electric voltage u(t) and/or an electric current i(t) of a RF signal on an electric cable in a calibration plane through measurement in the time domain using a time domain measuring device, wherein a device under test can be connected electrically with the calibration plane, wherein, in a measuring step, using a directional coupler, a first component $v_3(t)$ of a first RF signal which, starting out from a signal input, runs in the direction of the calibration plane through the directional coupler, is decoupled, fed to the time domain measuring device at a first measuring input and measured there, and a second component $v_4(t)$ of a second RF signal which, starting out from the calibration plane, runs in the direction of the signal input through the directional coupler, is decoupled, fed to the time domain measuring device at a second measuring input and measured there, wherein the signal components $v_3(t)$, $v_4(t)$ are, by a first mathematical operation, transformed into the frequency domain as wave quantities $V_3(f)$ and $V_4(f)$, then absolute wave quantities $a_2$ and $b_2$ in the frequency domain are determined in the calibration plane from the wave quantities $V_3(f)$ and $V_4(f)$ using calibration parameters ($e_{00,r}$, $e_{01,r}$, $e_{10,r}$, $e_{11,r}$), and the determined absolute wave quantities $a_2$ and $b_2$ are, by a second mathematical operation, converted into the electric voltage u(t) and/or the electric current i(t) of the RF signal in the time domain in the calibration plane, wherein the calibration parameters link the wave quantities $V_3(f)$ and $V_4(f)$ mathematically with the absolute wave quantities $a_2$ and $b_2$ in the calibration plane, such that the first measuring input of the time domain measuring device has a reflection coefficient $\Gamma_3 \neq 0$ and/or the second measuring input of the time domain measuring device has a reflection coefficient $\Gamma_4 \neq 0$, and in a preceding calibration step, the calibration parameters ($e_{00,r}$, $e_{01,r}$, $e_{10,r}$, $e_{11,r}$) are determined, with the aid of a calibration device, in relation to the frequency f and in relation to a calibration standard with known reflection coefficient $\Gamma_{DUT}$ of at least one of the measuring inputs of the time domain measuring device, and the wave quantities $a_2$ and $b_2$ are determined in the measuring step from the wave quantities $V_3(f)$ and $V_4(f)$ using the calibration parameters ($e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$), wherein, during the calibration step the signal input of the directional coupler is connected with a first measuring port S1, the first measuring output of the directional coupler is connected with a second measuring port S3 and the second measuring output of the directional coupler is connected with a third measuring port S4 of the calibration device, wherein one or more measuring standards with known reflection coefficients are connected to a signal output of the directional coupler connected with the calibration plane S2, wherein the calibration parameters ($e_{00,r}$, $e_{01,r}$, $e_{10,r}$, $e_{11,r}$) link the wave quantity $b_3$ running in at the second measuring port S3 and the wave quantity $b_4$ running in at the third measuring port S4 with the wave quantities $b_2$, $a_2$ running in and out in the calibration plane (14, S2) as follows:

$$\begin{pmatrix} b_4 \\ b_2 \end{pmatrix} = \begin{pmatrix} e_{00,r} & e_{01,r} \\ e_{10,r} & e_{11,r} \end{pmatrix} \begin{pmatrix} b_3 \\ a_2 \end{pmatrix}$$

wherein the scattering parameters $S_{xy}$ (x=1-4, y=1-4) of the scattering matrix S of the four-port with the ports S1, S2, S3, S4, in particular of the directional coupler together with input cables, are determined with the aid of the calibration apparatus, wherein the calibration parameters $e_{00,r}$, $e_{01,r}$, $e_{10,r}$, $e_{11,r}$, in relation to the reflection coefficients of the time domain measuring device $\Gamma_3$, $\Gamma_4$ are determined from the scattering parameters $S_{xy}$, wherein the calibration parameters are determined from the scattering parameters as follows:

$$e_{00,r} = \frac{S_{41} - \Gamma_3 S_{33} S_{41} + \Gamma_3 S_{31} S_{43}}{S_{31} + \Gamma_4 S_{34} S_{41} - \Gamma_4 S_{31} S_{44}},$$

$$e_{01,r} = \frac{S_{31} S_{42} - S_{32} S_{41}}{S_{31} + \Gamma_4 S_{34} S_{41} - \Gamma_4 S_{31} S_{44}},$$

$$e_{10,r} = \frac{\Gamma_4 S_{24} S_{41} + \Gamma_3 (\Gamma_4 S_{24}(S_{31} S_{43} - S_{33} S_{41}) + S_{23}(S_{31} + \Gamma_4 S_{34} S_{41} - \Gamma_4 S_{31} S_{44}))}{S_{31} + \Gamma_4 S_{34} S_{41} - \Gamma_4 S_{31} S_{44}} + \frac{S_{21}(1 - \Gamma_4 S_{44} - \Gamma_3 (S_{33} + \Gamma_4 S_{34} S_{43} - \Gamma_4 S_{33} S_{44}))}{S_{31} + \Gamma_4 S_{34} S_{41} - \Gamma_4 S_{31} S_{44}},$$

$$e_{11,r} = \frac{\Gamma_4 S_{24}(-S_{32} S_{41} + S_{31} S_{42}) + S_{22}(S_{31} + \Gamma_4 S_{34} S_{41} - \Gamma_4 S_{31} S_{44}) - S_{21}(S_{32} + \Gamma_4 S_{34} S_{42} - \Gamma_4 S_{32} S_{44})}{S_{31} + \Gamma_4 S_{34} S_{41} - \Gamma_4 S_{31} S_{44}}.$$

wherein the scattering parameters $S_{xy}$ are determined through measurement of the values $b_1/a_1$, $b_3/a_3$, $b_4/a_4$, $b_3/a_1$ or $b_1/a_3$, $b_4/a_1$ or $b_1/a_4$, $b_4/a_3$ or $b_3/a_4$ at the measuring ports S1, S3, S4 of the calibration device, wherein in each case preferably the measuring standards Match (M), Open (O), Short (S) with the known reflection coefficients $\Gamma_M$, $\Gamma_O$, $\Gamma_S$ are connected as devices under test in the calibration plane S2, where $a_1$, $a_3$, $a_4$ are wave quantities running in at the respective measuring ports S1, S3, S4 and $b_1$, $b_3$, $b_4$ are wave quantities running out at the respective measuring ports S1, S3, S4, and wherein the scattering parameters $S_{xy}$ are determined by means of the following equations:

$$S_{11} = i_{00}$$

$$S_{21} = i_{10}$$

$$S_{12} = i_{01}$$

$$S_{22} = i_{11}$$

$$S_{13} = S_{31} = \tilde{S}_{31} - \frac{\Gamma_{DUT} i_{10}}{1 - \Gamma_{DUT} i_{11}} S_{32},$$

$$S_{14} = S_{41} = \tilde{S}_{41} - \frac{\Gamma_{DUT} i_{10}}{1 - \Gamma_{DUT} i_{11}} S_{42}.$$

$$S_{23} = S_{32} = \frac{-(e_{11} - i_{11})(\Gamma_{DUT} i_{11} - 1)\tilde{S}_{31}}{(e_{11} \Gamma_{DUT} - 1) i_{10}},$$

$$S_{24} = S_{42} = \frac{(\Gamma_{DUT} i_{11} - 1)(e_{01} i_{10} + (i_{11} - e_{11})\tilde{S}_{41})}{(e_{11} \Gamma_{DUT} - 1) i_{10}},$$

$$S_{33} = \tilde{S}_{33} - \frac{\Gamma_{DUT} S_{23}}{1 - \Gamma_{DUT} i_{111}} \cdot S_{32}.$$

$$S_{43} = S_{34} = \tilde{S}_{34} - \frac{\Gamma_{DUT} S_{24}}{1 - \Gamma_{DUT} i_{11}} \cdot S_{32}.$$

$$S_{44} = \tilde{S}_{44} - \frac{\Gamma_{DUT} S_{24}}{1 - \Gamma_{DUT} i_{11}} \cdot S_{42},$$

where:

$\Gamma_{DUT}$ is the known reflection coefficient of the calibration standard used during the measurement;

$\widetilde{S_{xy}}$ are the $b_x/a_y$ measurable at the measuring ports S1, S3, S4; and $$i_{00} = \tilde{S}_{11,M},$$

$$e_{00} = \frac{\tilde{S}_{41,M}}{\tilde{S}_{31,M}},$$

$$i_{10} i_{01} = \frac{(\Gamma_O - \Gamma_S)(\tilde{S}_{11,O} - \tilde{S}_{11,M})(\tilde{S}_{11,S} - \tilde{S}_{11,M})}{\Gamma_O \Gamma_S (\tilde{S}_{11,O} - \tilde{S}_{11,S})},$$

$$e_{10} e_{01} = \frac{(\Gamma_O - \Gamma_S) \left( \frac{\tilde{S}_{41,O}}{\tilde{S}_{31,O}} - \frac{\tilde{S}_{41,M}}{\tilde{S}_{31,M}} \right) \left( \frac{\tilde{S}_{41,S}}{\tilde{S}_{31,S}} - \frac{\tilde{S}_{41,M}}{\tilde{S}_{21,M}} \right)}{\Gamma_O \Gamma_S \left( \frac{\tilde{S}_{41,O}}{\tilde{S}_{31,O}} - \frac{\tilde{S}_{41,S}}{\tilde{S}_{31,S}} \right)},$$

$$i_{11} = \frac{\Gamma_S(\tilde{S}_{11,O} - \tilde{S}_{11,M}) - \Gamma_O(\tilde{S}_{11,S} - \tilde{S}_{11,M})}{\Gamma_O \Gamma_S (\tilde{S}_{11,O} - \tilde{S}_{11,S})},$$

$$e_{11} = \frac{\Gamma_S \left( \frac{\tilde{S}_{41,O}}{\tilde{S}_{31,O}} - \frac{\tilde{S}_{41,M}}{\tilde{S}_{31,M}} \right) - \Gamma_O \left( \frac{\tilde{S}_{41,S}}{\tilde{S}_{31,S}} - \frac{\tilde{S}_{41,M}}{\tilde{S}_{31,M}} \right)}{\Gamma_O \Gamma_S \left( \frac{\tilde{S}_{41,O}}{\tilde{S}_{31,O}} - \frac{\tilde{S}_{41,S}}{\tilde{S}_{31,S}} \right)},$$

where $\Gamma_O$, $\Gamma_S$, $\Gamma_M$ are known reflection coefficients of the calibration standards Open (O), Short (S) and Match (M), and $\widetilde{S_{xy,K}}$ are the $b_x/a_y$ measurable at the measuring ports with connected calibration standard K.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 4 shows a representation of the four-port with the scattering matrix S (directional coupler together with input cables, FIG. 4a), a representation of the error two-port with the error matrix E (FIG. 4b) and a representation of the error two-port I (FIG. 4c) for the measuring setup according to FIG. 1;

FIG. 5 shows amounts of the entries $S_{xy}$ (x=1-4, y=1-4) of the scattering matrix S of an exemplary setup in relation to the frequency (x-axis: frequency f/Hz; y-axis: $/S_{xy}//$dB); the continuous lines show the values determined in the calibration step; the crosses show a simulated reference;

DESCRIPTION OF THE PREFERRED EMBODIMENT(S)

Figure 1:
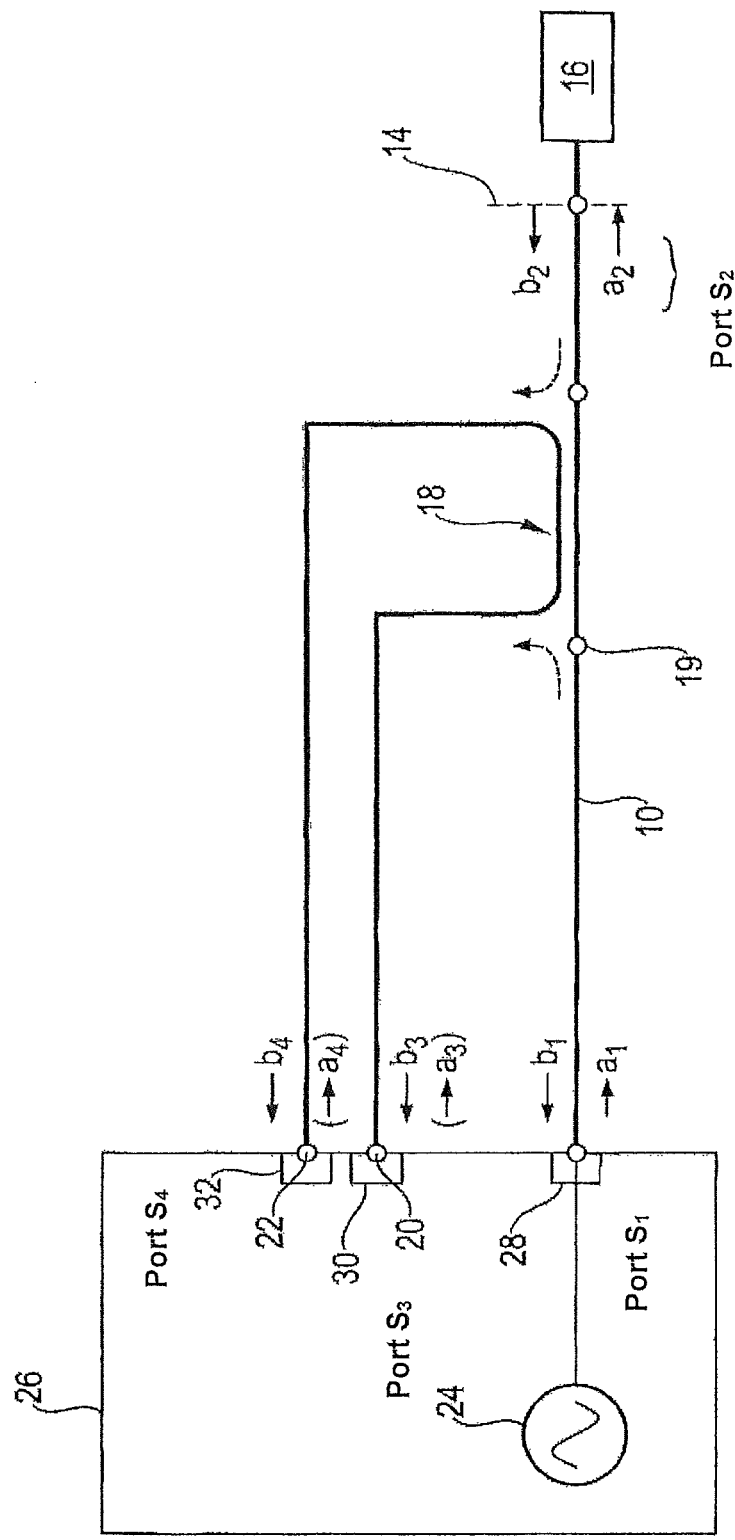
FIG. 1 shows a schematic representation of a measuring setup for carrying out a calibration step of the method according to the invention in the frequency domain.

In describing the preferred embodiment of the present invention, reference will be made herein to FIGS. 1-7 of the drawings in which like numerals refer to like features of the invention.

The invention is based on the knowledge that the method described in the document WO2013/143650 A1 only provides exact results if the two measuring inputs of the time domain measuring device have reflection-free terminations. When carrying out the calibration it was assumed that the calibration apparatus had already been calibrated previously to the measuring ports used and will thus behave ideally. One therefore obtains error matrices E and I for an ideal adaptation of the measuring ports of the calibration apparatus. In contrast, the calibration parameters which are necessary during the measuring step in order to obtain an exact measurement depend on the reflection coefficients $\Gamma_3$ and $\Gamma_4$ at the measuring inputs of the time domain measuring device. The conventional error matrix E thus only leads to exact results if, for the measuring inputs, it is the case that $\Gamma_3 = \Gamma_4 = 0$.

In contrast, according to the invention any time domain measuring devices can be connected to the measuring outputs of the directional coupler for the measurement in the time domain, since the calibration parameters are determined in relation to the reflection coefficients at the measuring inputs of the time domain measuring device. The reflection coefficients $\Gamma_3$ and $\Gamma_4$ of the measuring inputs of the time domain measuring device are known when determining the voltage and/or the current in the measuring step, or can be determined through separate measurement, so that the frequency-dependent $e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$ can be used as calibration parameters.

In the calibration step, it has proved practical to connect the signal input of the directional coupler with a first measuring port S1, to connect the first measuring output of the directional coupler with a second measuring port S3 and the second measuring output of the directional coupler with a third measuring port S4 of the calibration device. At the same time, one or more measuring standards with known reflection coefficients $\Gamma_k$ are connected to a signal output of the directional coupler connected with the calibration plane S2.

The determination of the wave quantities $a_2$ and $b_2$ in the calibration plane from the wave quantities $b_3$ and $b_4$ in the measuring planes can be carried out particularly quickly and reliably if the calibration parameters $e_{00,r}$, $e_{01,r}$, $e_{10,r}$, $e_{11,r}$ link the wave quantity $b_3$ running in at the second measuring port S3 and the wave quantity $b_4$ running in at the third measuring port S4 with the wave quantities $b_2$, $a_2$ running in and out in the calibration plane S2 as follows:

$$\begin{pmatrix} b_4 \\ b_2 \end{pmatrix} = \begin{pmatrix} e_{00,r} & e_{01,r} \\ e_{10,r} & e_{11,r} \end{pmatrix} \begin{pmatrix} b_3 \\ a_2 \end{pmatrix}.$$

According to the invention, the determination of the calibration parameters $e_{00,r}$, $e_{01,r}$, $e_{10,r}$, $e_{11,r}$ can be simplified in that the scattering parameters $S_{xy}$ (x=1-4, y=1-4) of the scattering matrix S of the four-port with the ports S1, S2, S3, S4, in particular the scattering matrix S of the directional coupler together with input cables, are determined with the aid of the calibration apparatus, and the calibration parameters $e_{00,r}$, $e_{01,r}$, $e_{10,r}$, $e_{11,r}$ in relation to the reflection coefficients of the time domain measuring device $\Gamma_3$ and $\Gamma_4$ are then determined from the scattering parameters $S_{xy}$.

In other words, the four-port whose scattering parameters $S_{xy}$ are determined has the following four ports:
 a first port S1 which represents the signal input of the directional coupler and which is connected with the first measuring port of the calibration apparatus during calibration,
 a second port S2, which is connected with the signal output of the directional coupler and represents the calibration plane, whereby the devices under test and the measuring standards can be connected at the second port S2, a third port S3, which represents the first signal output of the directional coupler or is connected with this, and which is connected with the second measuring port of the calibration apparatus during calibration, a fourth port S4, which represents the second signal output of the directional coupler or is connected with this, and which is connected with the third measuring port of the calibration apparatus during calibration.

This four-port is present in unchanged form during the calibration step and during the measuring step (or changes in the input cable to the directional coupler have no effect, since the terms dependent on the input cable are eliminated during the determination of $e_{xy}$), so that the determined scattering parameters $S_{xy}$ of the four-port determined during the calibration are still correct during the measuring step and can be used for determination of the corrected error matrix $E_r$. In this relationship it is to be emphasised that the scattering parameters of an n-port are by definition independent of the external wiring. In contrast, the error matrix $E_r$, the terms of which are needed during the measurement, depends on the reflection coefficients at the measuring ports of the time domain measuring device, but not on the properties of the input cable between the signal generator and the signal input of the directional coupler.

In other words, the (uncorrected) error matrix E, as determined in the document WO2013/143650 A1, is only valid where $\Gamma_3=\Gamma_4=0$, which is not generally guaranteed in a time domain measuring device. This can affect the measuring accuracy of the method described in the document WO2013/143650 A1.

However, with the method according to the invention, a corrected error matrix $E_r$ can be determined from the scattering parameters $S_{xy}$ using the known reflection coefficients $\Gamma_3$, $\Gamma_4$ of the time domain measuring device, as follows:

$$e_{00,r} = \frac{S_{41} - \Gamma_3 S_{33} S_{41} + \Gamma_3 S_{31} S_{43}}{S_{31} + \Gamma_4 S_{34} S_{41} - \Gamma_4 S_{31} S_{44}},$$

$$e_{01,r} = \frac{S_{31} S_{42} - S_{32} S_{41}}{S_{31} + \Gamma_4 S_{34} S_{41} - \Gamma_4 S_{31} S_{44}},$$

$$e_{10,r} = \frac{\Gamma_4 S_{24} S_{41} + \Gamma_3(\Gamma_4 S_{24}(S_{31} S_{43} - S_{33} S_{41}) + S_{23}(S_{31} + \Gamma_4 S_{34} S_{41} - \Gamma_4 S_{31} S_{44}))}{S_{31} + \Gamma_4 S_{34} S_{41} - \Gamma_4 S_{31} S_{44}} + \frac{S_{21}(1 - \Gamma_4 S_{44} - \Gamma_3(S_{33} + \Gamma_4 S_{34} S_{43} - \Gamma_4 S_{33} S_{44}))}{S_{31} + \Gamma_4 S_{34} S_{41} - \Gamma_4 S_{31} S_{44}},$$

$$e_{11,r} = \frac{\Gamma_4 S_{24}(-S_{32} S_{41} + S_{31} S_{42}) + S_{22}(S_{31} + \Gamma_4 S_{34} S_{41} - \Gamma_4 S_{31} S_{44}) - S_{21}(S_{32} + \Gamma_4 S_{34} S_{42} - \Gamma_4 S_{32} S_{44})}{S_{31} + \Gamma_4 S_{34} S_{41} - \Gamma_4 S_{31} S_{44}}.$$

Preferably, the scattering parameters $S_{xy}$ are determined by measuring the values $\widetilde{S_{11}} = b_1/a_1$, $\widetilde{S_{33}} = b_3/a_3$, $\widetilde{S_{44}} = b_4/a_4$, $\widetilde{S_{31}} = b_3/a_1$ or $\widetilde{S_{13}} = b_1/a_3$, $\widetilde{S_{41}} = b_4/a_1$ or $\widetilde{S_{14}} = b_1/a_4$, $\widetilde{S_{43}} = b_4/a_3$ or $\widetilde{S_{34}} = b_3/a_4$ at the measuring ports S1, S3, S4 of the calibration device, where one or more measuring standards such as Match M, Open O and/or Short S with the known reflection coefficients $\Gamma_M$, $\Gamma_O$, $\Gamma_S$ are connected as devices under test in the calibration plane S2, where $a_1$, $a_3$, $a_4$ are the wave quantities running in at the respective measuring ports S1, S3, S4 and $b_1$, $b_3$, $b_4$ are the wave quantities running out at the respective measuring ports S1, S3, S4.

Alternatively, determination is equally possible using other measuring standards. In other words, for the individual measuring standards, where necessary the wave quantities running in and out at the three measuring ports of the calibration apparatus are measured on a frequency-dependent basis, whereby all 16 parameters of the scattering matrix S of the four-port can be determined from these measured values by means of the following equations.

$$S_{11} = i_{00}$$

$$S_{21} = i_{10}$$

$$S_{12} = i_{01}$$

$$S_{22} = i_{11}$$

$$S_{13} = S_{31} = \tilde{S}_{31} - \frac{\Gamma_{DUT} i_{10}}{1 - \Gamma_{DUT} i_{11}} S_{32},$$

$$S_{14} = S_{41} = \tilde{S}_{41} - \frac{\Gamma_{DUT} i_{10}}{1 - \Gamma_{DUT} i_{11}} S_{42}.$$

$$S_{23} = S_{32} = \frac{-(e_{11} - i_{11})(\Gamma_{DUT} i_{11} - 1)\tilde{S}_{31}}{(e_{11} \Gamma_{DUT} - 1) i_{10}},$$

$$S_{24} = S_{42} = \frac{(\Gamma_{DUT} i_{11} - 1)(e_{01} i_{10} + (i_{11} - e_{11})\tilde{S}_{41})}{(e_{11} \Gamma_{DUT} - 1) i_{10}},$$

$$S_{33} = \tilde{S}_{33} - \frac{\Gamma_{DUT} S_{23}}{1 - \Gamma_{DUT} i_{11}} \cdot S_{32}.$$

$$S_{43} = S_{34} = \tilde{S}_{34} - \frac{\Gamma_{DUT} S_{24}}{1 - \Gamma_{DUT} i_{11}} \cdot S_{32}.$$

$$S_{44} = \tilde{S}_{44} - \frac{\Gamma_{DUT} S_{24}}{1 - \Gamma_{DUT} i_{11}} \cdot S_{42},$$

where $\Gamma_{DUT}$ is the known reflection coefficient of the calibration standard used;

$\widetilde{S_{xy}}$ are the $b_x/a_y$ measurable at the measuring ports S1, S3, S4; and $$i_{00} = \tilde{S}_{11,M},$$

$$e_{00} = \frac{\tilde{S}_{41,M}}{\tilde{S}_{31,M}},$$

$$i_{10} i_{01} = \frac{(\Gamma_O - \Gamma_S)(\tilde{S}_{11,O} - \tilde{S}_{11,M})(\tilde{S}_{11,S} - \tilde{S}_{11,M})}{\Gamma_O \Gamma_S (\tilde{S}_{11,O} - \tilde{S}_{11,S})},$$

$$e_{10} e_{01} = \frac{(\Gamma_O - \Gamma_S)\left(\frac{\tilde{S}_{41,O}}{\tilde{S}_{31,O}} - \frac{\tilde{S}_{41,M}}{\tilde{S}_{31,M}}\right)\left(\frac{\tilde{S}_{41,S}}{\tilde{S}_{31,S}} - \frac{\tilde{S}_{41,M}}{\tilde{S}_{21,M}}\right)}{\Gamma_O \Gamma_S \left(\frac{\tilde{S}_{41,O}}{\tilde{S}_{31,O}} - \frac{\tilde{S}_{41,S}}{\tilde{S}_{31,S}}\right)},$$

$$i_{11} = \frac{\Gamma_S(\tilde{S}_{11,O} - \tilde{S}_{11,M}) - \Gamma_O(\tilde{S}_{11,S} - \tilde{S}_{11,M})}{\Gamma_O \Gamma_S (\tilde{S}_{11,O} - \tilde{S}_{11,S})},$$

$$e_{11} = \frac{\Gamma_S \left(\frac{\tilde{S}_{41,O}}{\tilde{S}_{31,O}} - \frac{\tilde{S}_{41,M}}{\tilde{S}_{31,M}}\right) - \Gamma_O \left(\frac{\tilde{S}_{41,S}}{\tilde{S}_{31,S}} - \frac{\tilde{S}_{41,M}}{\tilde{S}_{31,M}}\right)}{\Gamma_O \Gamma_S \left(\frac{\tilde{S}_{41,O}}{\tilde{S}_{31,O}} - \frac{\tilde{S}_{41,S}}{\tilde{S}_{31,S}}\right)},$$

where $\Gamma_O$, $\Gamma_S$, $\Gamma_M$ are the known reflection coefficients of the calibration standards Open, Short and Match, and $\widetilde{S_{xy,K}}$ are the $b_x/a_y$ measurable at the measuring ports S1, S3, S4 with connected calibration standard K.

These equations are simply to be understood as an exemplary means of determining the scattering parameters $S_{xy}$ of the four-port. Alternative means of calculation can also be used. However, the above method has the advantage that the entries of the error matrices E and I which have in any case already been determined (see document WO2013/143650 A1) can be used, without additional measurements needing to be carried out and/or other measuring standards connected. The skilled person will for example recognise that the $S_{xy}$ can also be determined without reference to the $e_{xy}$ and/or the $i_{xy}$, solely from the directly measurable $\widetilde{S_{xy,K}}$.

A particularly simple measuring setup using economical electronic components is achieved in that the signal values $v_3(t)$ and $v_4(t)$ are in each case an electric voltage.

A particularly simple and functionally reliable measuring setup is achieved in that an oscilloscope is used as time domain measuring device, for example a digital oscilloscope, which can be used for time- and value-range quantisation of the signal.

A particularly fast and at the same time precise transformation between frequency domain and time domain which can be carried out without complex calculation is achieved in that the first mathematical operation is an FFT (Fast Fourier Transform) and the second mathematical operation an inverse FFT (IFFT—Inverse Fast Fourier Transform).

The transformation of the measured signal components $v_3(t)$ and $v_4(t)$ from the time domain into the frequency domain can for example be carried out according to the following calculation steps:

$$\{V_3(l \cdot \Delta f)\} = FFT\{v_3(k \cdot \Delta t)\}$$
$$\{V_4(l \cdot \Delta f)\} = FFT\{v_4(k \cdot \Delta t)\}$$
$$\text{where } k = 0, 1, \ldots, N-1$$
$$\text{and } l = 0, 1, \ldots, \frac{N-1}{2},$$

where N is a number of data points, $\Delta f$ a frequency increment with $\Delta f = 2 f_{max}/(N-1)$, $\Delta t$ a time increment, where $f_{max}$ designates the maximum frequency for which calibration data are available. Since the measured voltages are real values, and therefore the resulting Fourier spectrum can be expected to be symmetrical around f=0, it is sufficient to consider the spectral components for f≥0.

The wave quantities $b_3$ and $b_4$ are preferably determined from the voltages $V_3$ and $V_4$ as follows:

$$b_3 = \frac{V_3}{(1+\Gamma_3)\sqrt{Z_D}}$$
$$b_4 = \frac{V_4}{(1+\Gamma_4)\sqrt{Z_D}},$$

where $Z_0$ designates the impedance in relation to which the reflection coefficients $\Gamma_3$, $\Gamma_4$ were determined. Usually, $Z_0 = 50\Omega$.

The absolute wave quantities $a_2$, $b_2$ in the calibration plane are determined from the wave quantities $b_3$, $b_4$, with the aid of the calibration parameters ($e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$), through corresponding resolution of the equation system $$\begin{pmatrix} b_4 \\ b_2 \end{pmatrix} = \begin{pmatrix} e_{00,r} & e_{01,r} \\ e_{10,r} & e_{11,r} \end{pmatrix} \begin{pmatrix} b_3 \\ a_2 \end{pmatrix},$$

and the voltage $V_2(f)$ and the current $I_2(f)$ in the calibration plane are calculated from these by means of the following calculation steps:

$$V_2 = \sqrt{Z_1}\,(a_2 + b_2)$$
$$I_2 = \sqrt{\frac{1}{Z_1}}\,(a_2 - b_2),$$

where $Z_1$ designates the system impedance in the calibration plane.

The transformation of the voltage $V_2(f)$ and of the current $I_2(f)$ from the frequency domain back into the time domain can for example be carried out according to the following calculation steps:

$$\{u(k \cdot \Delta t)\} = IFFT\{V_2(l \cdot \Delta f)\},$$
$$\{i(k \cdot \Delta t)\} = IFFT\{I_2(l \cdot \Delta f)\}$$
$$\text{where } k = 0, 1, \ldots, N-1$$
$$\text{and } l = 0, 1, \ldots, \frac{N-1}{2}.$$

Here too, it was possible to exploit the fact that the resulting voltage and the resulting current are real values, so that only the frequency components f>0 are required as input values for the IFFT.

The desired measured values u(t) and i(t) in the calibration plane are obtained.

A vectorial network analyser (VNA or vectorial NWA) with at least three measuring ports is preferably used as a calibration device.

Once the calibration parameters used in the method according to the invention have been determined in the calibration step, the voltage u(t) and/or the current i(t) in the calibration plane can then be determined in the measuring step in that the first measuring output of the directional coupler and the second measuring output of the directional coupler are isolated from the calibration device and connected with the measuring inputs of the time domain measuring device, while the first RF signal is fed via the signal input of the directional coupler.

An arrangement for carrying out the calibration step of the method according to the invention is represented schematically in FIG. 1. This arrangement features a directional coupler 18 with a signal input 19 which is connected via an input cable 10 with a first measuring port S1 28 of a calibration device 26 (vectorial network analyser VNA). A calibration plane 14 is connected with the signal output of the directional coupler. The calibration plane 14 is designed such that a device under test (DUT) 16 can be connected electrically to the calibration plane 14. This DUT 16 is for example a calibration standard, an electronic circuit which is to be tested or an electronic component. A component of a first RF signal, which runs within the directional coupler 18 from the signal input 19 in the direction of the calibration plane 14, and a component of a second RF signal, which runs within the directional coupler 18 from the calibration plane 14 in the direction of the signal input 19, are decoupled by means of the directional coupler 18 with two measuring outputs 20, 22. The first signal output 20 of the directional coupler 18 is connected with a second measuring port S3 30 of the VNA, and the second signal output 22 of the directional coupler 18 is connected with a third measuring port S4 32 of the VNA. Suitable for use as a directional coupler 18 is any component which possesses directionality, i.e., which makes it possible to distinguish the component of the first RF signal and the component of the second RF signal.

A signal is input via the first measuring port 28. The calibration plane 14, which is connected with the signal output of the coupler 18, is represented by the port S2 of the four-port S with the ports S1 to S4 which is to be measured, since the device under test 16 which is to be measured is connected at this point. For this reason the calibration plane is also referred to as port S2 in the following description. The four-port S which is to be measured, which in the present case is used both in the calibration step and in the measuring step, thus substantially comprises the directional coupler 18 together with input cables.

The four-port between the three measuring ports S1, S3 and S4 (28, 30, 32) of the VNA and the calibration plane S2 14 is represented schematically in FIG. 4a. This four-port can be broken down into two (error) two-ports, which are represented schematically in FIGS. 4b and 4c and as signal flow diagrams in FIGS. 3a and 3b and which can be described through the two error matrices I and E. The two-port with the entries $$\begin{pmatrix} i_{00} & i_{01} \\ i_{10} & i_{11} \end{pmatrix},$$

also referred to as error coefficients, is located between the measuring port S1 28 of the NWA and the calibration plane S2 14; the two-port with the error coefficients $$\begin{pmatrix} e_{00} & e_{01} \\ e_{10} & e_{11} \end{pmatrix}$$

is located between, on the one hand, the measuring ports S3 30 and S4 32 of the VNA 26, to which the measuring outputs 20, 22 of the coupler 18 are connected, and on the other hand the calibration plane S2 14.

Firstly, through the calibration, the four entries $e_{xy}$ of the (uncorrected) error matrix E are to be determined, which express the relationship between the wave quantities $a_2$ and $b_2$ in the calibration plane and the decoupled wave quantities $b_3$ and $b_4$ decoupled through the directional coupler 18 for the four-port S which is terminated in a reflection-free manner at the measuring ports S3 and S4. Consequently, the VNA 26 is terminated in a reflection-free manner at its measuring ports. Then, with the aid of the entries $e_{xy}$, the (corrected) calibration parameters $$\begin{pmatrix} e_{00,r} & e_{01,r} \\ e_{10,r} & e_{11,r} \end{pmatrix}$$

of the (corrected) error matrix $E_r$ are determined, which are not only frequency-dependent, but take into consideration the measuring inputs of the time domain measuring device 34 which are also not terminated in a reflection-free manner.

In the measurement which is then to be carried out in the time domain, only the values $v_3(t)$ and $v_4(t)$ are determined, and from these the wave quantities $b_3$ and $b_4$ are determined, from which wave quantities as well as voltage $u(t)$ and current $i(t)$ in the calibration plane 14 will then be derived.

For the two error two-ports, which are described through the error matrices I and E, the following relationship can be derived from the signal flow diagram in FIG. 3 using the reflection coefficients $\Gamma$ in the calibration plane:

$$\tilde{S}_{11} = \frac{b_1}{a_1} = i_{00} + \frac{i_{10}i_{01} \cdot \Gamma}{1 - i_{11} \cdot \Gamma}, \quad (1)$$

$$\frac{\tilde{S}_{41}}{\tilde{S}_{31}} = \frac{b_4}{b_3} = e_{00} + \frac{e_{10}e_{01} \cdot \Gamma}{1 - e_{11} \cdot \Gamma}.$$

$\widetilde{S_{xy,\bar{x}}}$ hereby designates the scattering parameters which can be measured by the VNA 26. If three calibration standards with different known reflection coefficients $\Gamma_k$ are connected in the calibration plane, then linear equation systems can in each case be derived from these equations in order to determine the error coefficients $e_{00}$, $i_{00}$, $e_{11}$, $i_{11}$, $e_{10}e_{01}$, $i_{10}i_{01}$. If one uses as calibration standards an Open (O) with the reflection coefficient $\Gamma_O$, a Short (S) with the reflection coefficient $\Gamma_S$ and a reflection-free termination (Match, M=0) with the reflection coefficient $\Gamma_M$=0, then one obtains the known OSM calibration:

$$i_{00} = \tilde{S}_{11,M}, \quad (2)$$

$$e_{00} = \frac{\tilde{S}_{41,M}}{\tilde{S}_{31,M}},$$

$$i_{10}i_{01} = \frac{(\Gamma_O - \Gamma_S)(\tilde{S}_{11,O} - \tilde{S}_{11,M})(\tilde{S}_{11,S} - \tilde{S}_{11,M})}{\Gamma_O \Gamma_S (\tilde{S}_{11,O} - \tilde{S}_{11,S})},$$

$$e_{10}e_{01} = \frac{(\Gamma_O - \Gamma_S)\left(\frac{\tilde{S}_{41,O}}{\tilde{S}_{31,O}} - \frac{\tilde{S}_{41,M}}{\tilde{S}_{31,M}}\right)\left(\frac{\tilde{S}_{41,S}}{\tilde{S}_{31,S}} - \frac{\tilde{S}_{41,M}}{\tilde{S}_{31,M}}\right)}{\Gamma_O \Gamma_S \left(\frac{\tilde{S}_{41,O}}{\tilde{S}_{31,O}} - \frac{\tilde{S}_{41,S}}{\tilde{S}_{31,S}}\right)},$$

$$i_{11} = \frac{\Gamma_S(\tilde{S}_{11,O} - \tilde{S}_{11,M}) - \Gamma_O(\tilde{S}_{11,S} - \tilde{S}_{11,M})}{\Gamma_O \Gamma_S (\tilde{S}_{11,O} - \tilde{S}_{11,S})},$$

$$e_{11} = \frac{\Gamma_S\left(\frac{\tilde{S}_{41,O}}{\tilde{S}_{31,O}} - \frac{\tilde{S}_{41,M}}{\tilde{S}_{31,M}}\right) - \Gamma_O\left(\frac{\tilde{S}_{41,S}}{\tilde{S}_{31,S}} - \frac{\tilde{S}_{41,M}}{\tilde{S}_{31,M}}\right)}{\Gamma_O \Gamma_S \left(\frac{\tilde{S}_{41,O}}{\tilde{S}_{31,O}} - \frac{\tilde{S}_{41,S}}{\tilde{S}_{31,S}}\right)},$$

where the $\widetilde{S_{xy,\bar{x}}}$ designate the scattering parameters measured with the calibration standard K.

The knowledge of these terms is sufficient in order to determine the reflection coefficient $\Gamma_{DUT}=a_2/b_2$ of a device under test ("DUT") in the calibration plane from the relationship between the measured wave quantities $b_4/b_3$. For this purpose:

$$\Gamma_{DUT} = \frac{\frac{b_4}{b_3} - e_{00}}{e_{10} \cdot e_{01} + e_{11}\left(\frac{b_4}{b_3} - e_{00}\right)} \quad (3)$$

However, in order to determine the absolute wave quantities $a_2$ and $b_2$ from $b_3$ and $b_4$ it is necessary to resolve the product $e_{10}e_{01}$ into its factors. For this purpose, the calibration is extended in the following. It should firstly be noted that the error matrix E obtained through the mathematical operation of the four-port-two-port reduction does not describe a reciprocal two-port, i.e. $e_{10} \neq e_{01}$. In contrast, the error matrix I describes the relationship between the measuring port S1 of the VNA 26 and the calibration plane 14, S2 and can thus be assumed to be reciprocal. Thus:

$$i_{10} = i_{01} = \pm \sqrt{i_{10} \cdot i_{01}} \quad (4)$$

The decision regarding the correct sign in equation (4) is equivalent to the correct determination of the phase of $i_{10}$ from two possibilities. To do this, one proceeds as follows: the phase at a frequency point must be known with adequate precision in order to decide on the sign. This can for example be done through an estimation of the electric length of the setup between the measuring port S1 of the VNA 26 and the calibration plane S2, 14. It is also assumed that the phase changes by less than 90° between two adjacent frequency points. The correct phase of $i_{10}$ can thus also be determined for all frequency points. The following relationships for $b_2$ can be derived from the graphs in FIGS. 3a and 3b:

$$b_2 = \frac{i_{10}a_1}{1 - i_{11}\Gamma_{DUT}} \quad (5)$$

$$b_2 = \frac{e_{10}b_3}{1 - e_{11}\Gamma_{DUT}}$$

Since both equations describe the same wave quantity, this means that $$e_{10} = i_{10} \cdot \frac{a_1}{b_3} \cdot \frac{1 - e_{11}\Gamma_{DUT}}{1 - i_{11}\Gamma_{DUT}} \quad (6)$$

In this case, $$\frac{a_1}{b_3} = \tilde{S}_{31}^{-1},$$

so that $e_{10}$ can be determined individually and, from this, using (2), also $e_{01}$. Using (3), (5) and the relationship $$a_2 = \frac{b_4 - e_{00}b_3}{e_{01}} \quad (7)$$

derived from the signal flow graphs according to FIG. 3, after determining the four coefficients of the error matrix E from measured $b_3$ and $b_4$, the absolute wave quantities $a_2$ and $b_2$ in the calibration plane 14 can now be determined for a time domain measuring device with reflection-free termination.

However, time domain measuring devices 34 such as oscilloscopes are generally not terminated in a perfectly reflection-free manner. Rather, they can display reflection coefficients $\Gamma_3 \neq 0$ and/or $\Gamma_4 \neq 0$ at their measuring inputs 36, 38, at which the signal components 72, 74 run in in the measuring step shown in FIG. 2. The entries $e_{xy}$ of the (uncorrected) error matrix E described above were determined on the assumption of a reflection-free termination of the time domain measuring device 34, so that no exact voltages and/or currents in the calibration plane can be determined if a time domain measuring device 34 with $\Gamma_3 \neq 0$ and/or $\Gamma_4 \neq 0$ is used.

In the following description, the procedure for determining the corrected calibration parameters $$\begin{pmatrix} e_{00,r} & e_{01,r} \\ e_{10,r} & e_{11,r} \end{pmatrix}$$

of the corrected error matrix $E_r$ with reference to the aforementioned (uncorrected) error matrix E is described, whereby in the method according to the invention the corrected calibration parameters $e_{xy,r}$ are used.

Figure 3A:
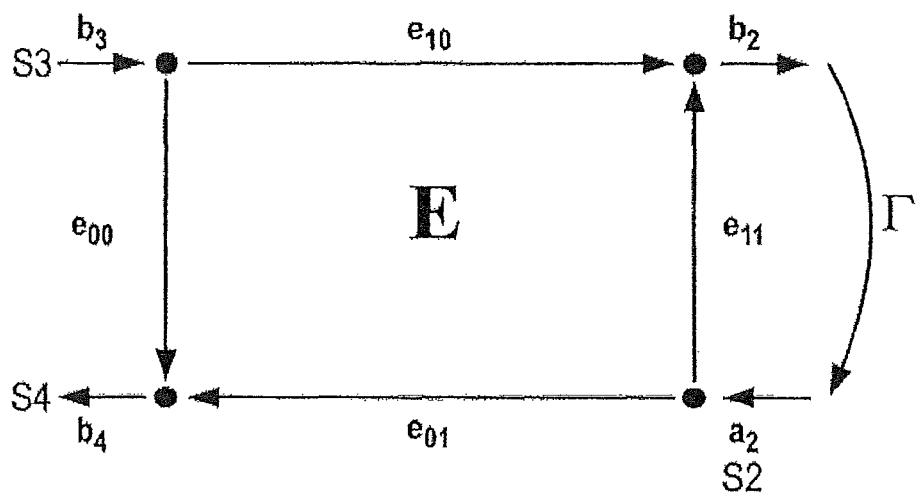
FIG. 3 shows a signal flow diagram of the error two-port with the error matrix E between measuring outputs $b_3$, $b_4$ of the directional coupler and the calibration plane (FIG. 3a) and a signal flow diagram of the error two-port I between the signal input of the directional coupler and the calibration plane (FIG. 3b) for the measuring setup according to FIG. 1.

This example involves the four-port as shown in FIG. 3a, described through its scattering matrix S. If this four-port represents the directional coupler 18 together with input cables, then the signal input 19 of the directional coupler 18 is connected with the measuring port S1 28 of the network analyser 26 during the calibration, and during the measurement is for example connected with a signal source 24. The measuring outputs 20 and 22 of the four-port/directional coupler 18 are connected with the measuring ports S3 and S4 of the VNA 26 during the calibration and are connected with the measuring inputs 36, 38 of the time domain measuring device 34 during the measurement. The calibration standards are connected with port S2 of the four-port, the calibration plane 14, during the calibration and the device under test 16 which is to be measured is connected with this during the measurement. It is therefore the object of the calibration procedure to determine the relationship between the measurable wave quantities $b_3$ and $b_4$ and the wave quantities $a_2$ and $b_2$ in the calibration plane 14. This relationship can, as explained above, be represented as a—not physically present—two-port with the error matrix E according to FIG. 3a:

$$\begin{pmatrix} b_4 \\ b_2 \end{pmatrix} = \begin{pmatrix} e_{00} & e_{01} \\ e_{10} & e_{11} \end{pmatrix}\begin{pmatrix} b_3 \\ a_2 \end{pmatrix} \quad (8)$$

As already shown above, all four scattering parameters or error terms $e_{xy}$ of this error two-port can be determined through the calibration, without explicit knowledge of the scattering matrix S of the underlying four-port. Nonetheless, the relationship between the two matrices E and S will be derived in the following. Under the assumption that reflection coefficients $\Gamma_3$ and $\Gamma_4$ occur at the measuring points S3 and S4, with which the measuring outputs of the directional coupler are connected, the following six equations can be arrived at:

$$\begin{pmatrix} b_1 \\ b_2 \\ b_3 \\ b_4 \end{pmatrix} = S\begin{pmatrix} a_1 \\ a_2 \\ a_3 \\ a_4 \end{pmatrix} = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix}\begin{pmatrix} a_1 \\ a_2 \\ a_3 \\ a_4 \end{pmatrix}, \quad (9)$$

$$a_3 = \Gamma_3 b_3,$$

$$a_4 = \Gamma_4 b_4.$$

It had been assumed above that $\Gamma_3 = \Gamma_4 = 0$ also applies to the time domain measuring device 34. Under this assumption, the (uncorrected) error matrix E is derived from equation (9) as follows (four-port-two-port reduction):

$$\begin{pmatrix} b_4 \\ b_2 \end{pmatrix} = \begin{pmatrix} e_{00} & e_{01} \\ e_{10} & e_{11} \end{pmatrix} \begin{pmatrix} b_3 \\ a_2 \end{pmatrix} = \begin{pmatrix} \frac{S_{41}}{S_{31}} & \frac{S_{31}S_{42} - S_{32}S_{41}}{S_{31}} \\ \frac{S_{21}}{S_{31}} & \frac{S_{22}S_{31} - S_{21}S_{32}}{S_{31}} \end{pmatrix} \begin{pmatrix} b_3 \\ a_2 \end{pmatrix} \quad (10)$$

If, in contrast, as when carrying out the measurement with an oscilloscope for example, it is assumed that $\Gamma_3 \neq 0$ and/or $\Gamma_4 \neq 0$ then the following equations result for the error terms $e_{xy,r}$ which take into consideration these reflection coefficients:

$$e_{00,r} = \xi \cdot [S_{41} - \Gamma_3 S_{33} S_{41} + \Gamma_3 S_{31} S_{43}], \quad (11)$$

$$e_{01,r} = \xi \cdot [S_{31} S_{42} - S_{32} S_{41}],$$

$$e_{10,r} = \xi \cdot [\Gamma_4 S_{24} S_{41} +$$

$$\Gamma_3(\Gamma_4 S_{24}(S_{31}S_{43} - S_{33}S_{41}) + S_{23}(S_{31} + \Gamma_4 S_{34}S_{41} - \Gamma_4 x S_{31}S_{44})) +$$

$$S_{21}(1 - \Gamma_4 S_{44} - \Gamma_3(S_{33} + \Gamma_4 S_{34}S_{43} - \Gamma_4 S_{33}S_{44}))],$$

$$e_{11,r} = \xi \cdot [\Gamma_4 S_{24}(-S_{32}S_{41} + S_{31}S_{42}) + S_{22}(S_{31} + \Gamma_4 S_{34}S_{41} -$$

$$\Gamma_4 S_{31}S_{44} - S_{21}(S_{32} + \Gamma_4 S_{34}S_{42} - \Gamma_4 S_{32}S_{44})]$$

$$mit \ \xi = \frac{1}{S_{31} + \Gamma_4 S_{34}S_{41} + \Gamma_4 S_{31}S_{44}}.$$

If the scattering parameters $S_{xy}$ of the four-port are known, then consequently calibration parameters can be calculated which take into account any known mismatches $\Gamma_x$ at the measuring inputs of the time domain measuring device 34. In the following section it will be explained how these scattering parameters $S_{xy}$ can be obtained during the calibration of the directional coupler 18 without additional calibration steps or standards.

The scattering parameters of the four-port according to FIG. 4a cannot be determined through a direct measurement since the calibration plane—which is also the port S2 of the four-port—is not connected with the VNA. If, however, a reciprocal four-port is used, these parameters can nonetheless be determined. Use can be made of the fact that calibration standards with known reflection coefficient $\Gamma_{DUT}$ in the calibration plane are present during the calibration. The calibration standard with which the following calculation is carried out can thereby be chosen arbitrarily, for example $\Gamma_{DUT} = \Gamma_O$, $\Gamma_{DUT} = \Gamma_S$ or $\Gamma_{DUT} = \Gamma_M$ apply selectively. If it is also assumed that apart from the calibration plane S2 all other ports of the four-port S1, S3, S4 are terminated in a reflection-free manner during the calibration, then on being input via the port S1:

$$a_2 = \Gamma_{DUT} b_2 = \Gamma_{DUT}(S_{22}a_2 + S_{21}a_1) = \frac{\Gamma_{DUT}S_{21}a_1}{1 - \Gamma_{DUT}S_{22}}. \quad (12)$$

If the VNA is now used for example to measure $b_3/a_1$, then these are not the scattering parameters $S_{31}$ of the four-port, since the necessary condition $a_2 = 0$ is not generally fulfilled. Therefore, the values measured by the VNA are designated as $$\tilde{S}_{xy} = \frac{b_y}{a_x}$$

in order to distinguish them from the scattering parameters $S_{xy}$ of the four-port. In order to be able to carry out the subsequent correction of the error terms by known reflection coefficients, as described above, the "true" scattering parameters of the four-port $S_{xy}$ must be determined from the measurements by the VNA $$\tilde{S}_{xy} = \frac{b_y}{a_x}.$$

Figure 3B:
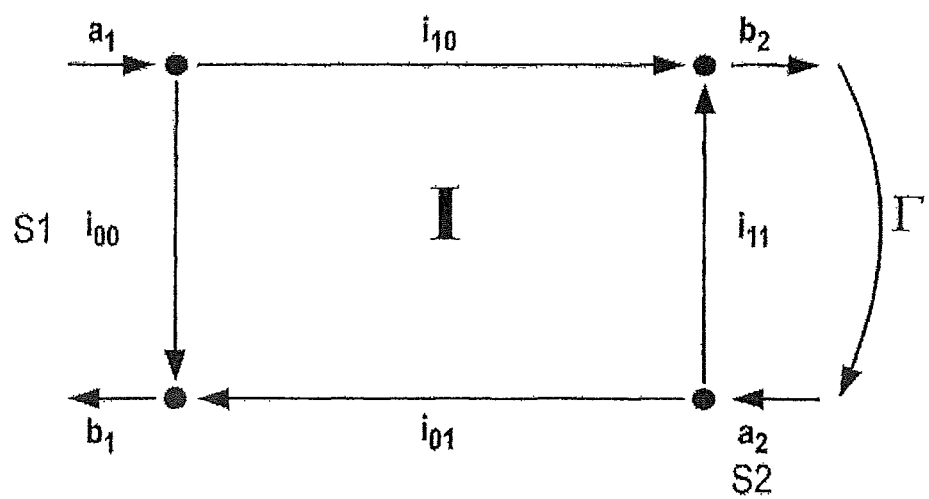

The already-determined error coefficients $e_{xy}$ and $i_{xy}$ are also used. If the definition of the error matrix I according to FIG. 3b is compared with the four-port S, then one obtains $$S_{11} = i_{00}$$

$$S_{21} = i_{10}$$

$$S_{12} = i_{01}$$

$$S_{22} = i_{11} \quad (13)$$

Also, with input at port S1 ($a_3 = a_4 = 0$), with the equations (12), (13) and a comparison of the $e_{xy}$ according to equation (2) and equation (10) one obtains:

$$S_{23} = S_{32} = \frac{-(e_{11} - i_{11})(\Gamma_{DUT} i_{11} - 1)\tilde{S}_{31}}{(e_{11}\Gamma_{DUT} - 1)i_{10}}, \quad (14)$$

$$S_{24} = S_{42} = \frac{(\Gamma_{DUT} i_{11} - 1)(e_{01} i_{10} + (i_{11} - e_{11})\tilde{S}_{41})}{(e_{11}\Gamma_{DUT} - 1)i_{10}},$$

$$S_{13} = S_{31} = \tilde{S}_{31} - \frac{\Gamma_{DUT} i_{10}}{1 - \Gamma_{DUT} i_{11}} S_{32},$$

$$S_{14} = S_{41} = \tilde{S}_{41} - \frac{\Gamma_{DUT} i_{10}}{1 - \Gamma_{DUT} i_{11}} S_{42}.$$

Under the assumption that the four-port is now fed in via the port S3 and the ports S1, S4 are terminated in a reflection-free manner, it can also be stated that:

$$b_3 = S_{33}a_3 + S_{32}a_2, \quad (15)$$

$$a_2 = \Gamma_{DUT} b_2 = \Gamma_{DUT}(S_{22}a_2 + S_{23}a_3) = \frac{\Gamma_{DUT}S_{23}}{1 - \Gamma_{DUT}S_{22}} \cdot a_3,$$

$$\tilde{S}_{33} = \frac{b_3}{a_3}\bigg|_{a_2 \neq 0} = S_{33} + \frac{\Gamma_{DUT}S_{23}}{1 - \Gamma_{DUT}S_{22}} \cdot S_{32},$$

$$S_{33} = \tilde{S}_{33} - \frac{\Gamma_{DUT}S_{23}}{1 - \Gamma_{DUT}i_{11}} \cdot S_{32}.$$

$S_{44}$ and $S_{34}$ of the four-port can also be derived if, analogously, an input via the port S4 is considered:

$$S_{44} = \tilde{S}_{44} - \frac{\Gamma_{DUT}S_{24}}{1 - \Gamma_{DUT}i_{11}} \cdot S_{42}, \quad (16)$$

$$S_{43} = S_{34} = \tilde{S}_{34} - \frac{\Gamma_{DUT}S_{24}}{1 - \Gamma_{DUT}i_{11}} \cdot S_{32}.$$

Thus, all 16 scattering parameters $S_{xy}$ are determined during the course of the calibration, without there needing to be a direct connection between the calibration plane S2 and the VNA 26. Using the equations (11), the corrected calibration parameters $e_{xy,r}$, which take into account any known mismatches during the measurement, can be determined in this way.

The measuring step for determining the electric voltage u(t) and the electric current i(t) of the RF signal in the calibration plane (14) in the method according to the invention is described in the following.

Figure 2:
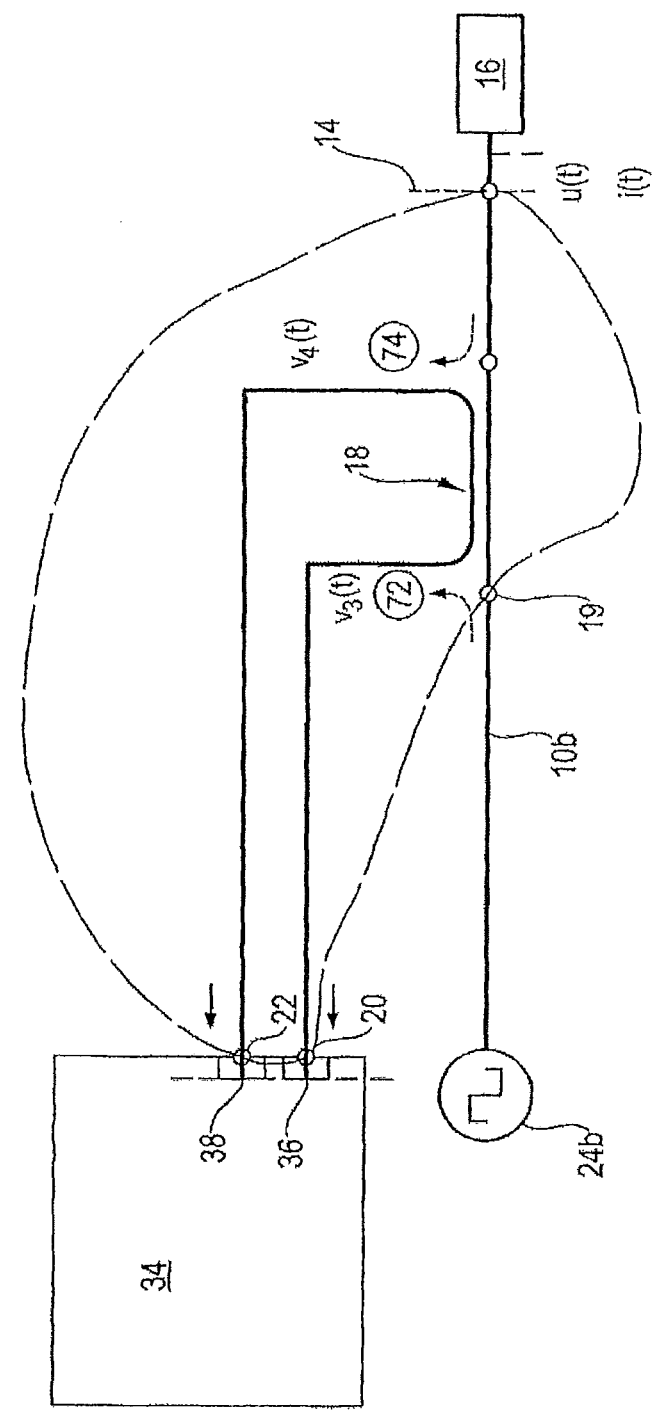
FIG. 2 shows a schematic representation of a measuring setup for carrying out a measuring step of the method according to the invention in the time domain.

FIG. 2 shows the setup for measuring the voltage u(t) and the current i(t) in the calibration plane 14 from the measured values of an oscilloscope or another time domain measuring device 34 $v_3(t)$ 72 and $v_4(t)$ 74 in a measuring plane. The measuring inputs 36, 38 of the time domain measuring device 34 are hereby connected with the measuring outputs 20 and 22 of the directional coupler 18, and any desired signal source 24b is connected with the signal input 19 of the directional coupler 18 via a, possibly modified, input cable 10b.

The use of the calibration parameters $e_{xy,r}$ is explained in the following. It should be emphasised that only the marked part of the setup (enclosed in a broken line) needs to remain unchanged in comparison with the calibration. This substantially involves the directional coupler 18 as far as the calibration plane 14 as well as the cables which connect the directional coupler 18 with the time domain measuring device 34. In contrast, changes—also in the characteristic impedance—to the other elements, for example the source and the load, have no influence on the measurement. It is assumed that the setup between the calibration plane 14 and the measuring inputs 36, 38 and the measuring outputs 20, 22 of the directional coupler 18 does not change in comparison with the calibration according to FIG. 1 if the obtained calibration coefficients are to remain valid. In contrast, changes to the signal source 24b and its input cable 10b to the directional coupler have no influence on the calibration.

In order to use the error matrix $E_r$ defined in the frequency domain, the voltages $v_3(t)$ and $v_4(t)$ recorded by the oscilloscope in the time domain are transformed into the corresponding values $V_3(f)$ and $V_4(f)$ in the frequency domain. In the following representation, the fast Fourier transform (FFT) is used for this purpose. Alternatively, in order to be able to process the large quantities of data which occur during measurements carried out with a high sampling rate in blocks with an adjustable time and frequency resolution, the short-time Fourier transform (STFT) can be used. Since, as a result of the measurement in the time domain, the phase information is inherently maintained between all spectral components, this setup is not limited to the measurement of monofrequency or periodic signals.

The measured voltages are represented—possibly through interpolation—as time-discrete vectors $\{v_3(k \cdot \Delta t)\}$ or $\{v_4(k \cdot \Delta t)\}$ with a time increment $\Delta t = 0.5/f_{max}$, where $f_{max}$ designates the maximum frequency for which calibration data are available and k=0, 1, . . . , N−1 is a running index over all N data points. These vectors are transformed into the frequency domain with the aid of the fast Fourier transform (FFT) and are then designated as $V_3(f)$ and $V_4(f)$:

$$\{V_3(l \cdot \Delta f)\} = FFT\{v_3(k \cdot \Delta t)\} \quad (17)$$

$$\{V_4(l \cdot \Delta f)\} = FFT\{v_4(k \cdot \Delta t)\} \quad (18)$$
where $k = 0, 1, \ldots, N-1$
and $l = 0, 1, \ldots, \frac{N-1}{2}$.

Since the measured voltages are real values, it is sufficient to consider the spectral components for f≥0. This leads to a frequency increment of $\Delta f = 2f_{max}/(N-1)$. The calibration coefficients $e_{xy,r}$ are brought into the same frequency pattern through interpolation.

With known reflection coefficients $\Gamma_3, \Gamma_4$ of the measuring inputs 36, 38 of the time domain measuring device 34, the following relationship between the voltages $V_3$ and $V_4$ and the wave quantities $b_3$ and $b_4$ results for each frequency point:

$$b_3 = \frac{V_3}{(1+\Gamma_3)\sqrt{Z_D}} \quad (19)$$

$$b_4 = \frac{V_4}{(1+\Gamma_4)\sqrt{Z_D}}, \quad (20)$$

where $Z_0$ designates the impedance in relation to which the reflection coefficients $\Gamma_3, \Gamma_4$ were determined. Since it was assumed during the calibration that $\Gamma_3=\Gamma_4=0$, the system impedance of the calibrated VNA determines the impedance $Z_0$. Usually, $Z_0$ is therefore 50Ω.

The absolute wave quantities $a_2, b_2$ in the calibration plane are determined from these wave quantities with the aid of the calibration parameters $(e_{00,r}(\Gamma_3, \Gamma_4), e_{01,r}(\Gamma_3, \Gamma_4), e_{10,r}(\Gamma_3, \Gamma_4), e_{11,r}(\Gamma_3, \Gamma_4))$ using the equations (3), (5) and (7), where $e_{xy}$ is in each case replaced with $e_{xy,r}(\Gamma_3, \Gamma_4)$, and the voltage $V_2$ and the current $I_2$ in the calibration plane are derived from these:

$$V_2 = \sqrt{Z_1}(a_2 + b_2) \quad (21)$$

$$I_2 = \sqrt{\frac{1}{Z_1}}(a_2 - b_2), \quad (22)$$

where $Z_1$ designates the system impedance in the calibration plane. This is the impedance on which the statement of the reflection coefficients $\Gamma_{O,S,M}$ of the calibration standards was based during the calibration. This need not be the physical line impedance in the calibration plane 14. Any choice of $Z_1$, which must, however, be consistent between calibration and measurement, has no influence on the measurement result. The time-discrete representation of the voltage u(t) and of the current i(t) in the calibration plane can be obtained from $V_2(f)$ and $I_2(f)$ with the aid of the inverse FFT (IFFT):

$$\{u(k \cdot \Delta f)\} = IFFT\{V_2(l \cdot \Delta f)\}, \quad (23)$$

$$\{i(k \cdot \Delta f)\} = IFFT\{I_2(l \cdot \Delta f)\} \quad (24)$$
where $k = 0, 1, \ldots, N-1$
and $l = 0, 1, \ldots, \frac{N-1}{2}$.

Here too it was possible to make use of the fact that the resulting voltage and the resulting current are real values, so that only the frequency components f>0 are required as input values for the IFFT.

Figure 6A:
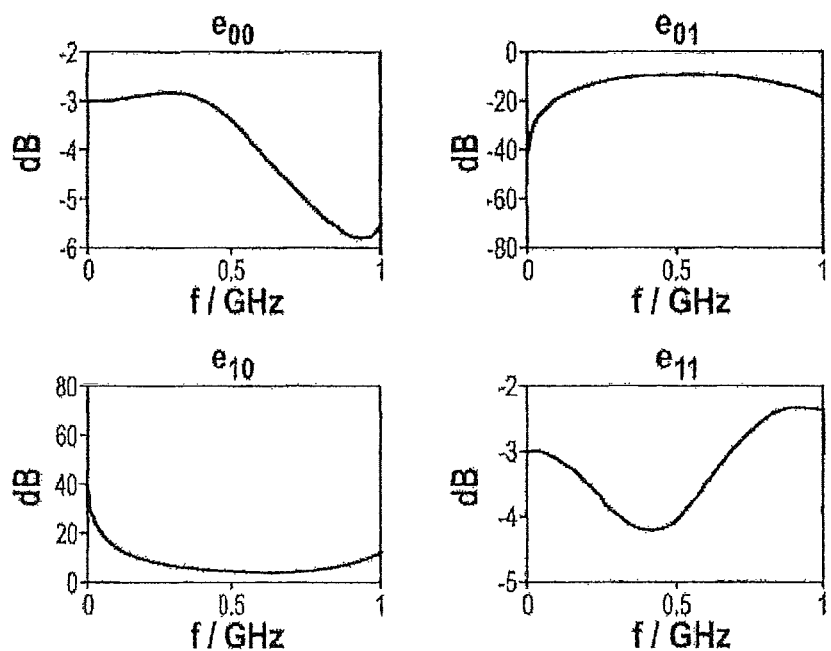
FIG. 6a shows a graphic representation of entries $e_{00}$, $e_{01}$, $e_{10}$ and $e_{11}$ of the error matrix E determined in the calibration step of the method according to the invention for the exemplary setup shown in FIG. 5, in relation to a frequency f.

In order to verify that the voltage u(t) and the current i(t) in the calibration plane 14 can also be determined exactly with the time domain measurement, with the aid of the calibration parameters $e_{xy,r}$, with non-ideal termination of the measuring inputs, a simulation was carried out using the software "Agilent ADS". A line coupler was used as directional coupler 18 for the measurement. The calibration step was carried out with an ideal 50Ω system. For the error matrix $$E = \begin{pmatrix} e_{00} & e_{01} \\ e_{10} & e_{11} \end{pmatrix},$$

the frequency-dependent values shown in FIG. 6a are obtained.

For the measurement, on the other hand, to achieve a 50Ω termination at the measuring ports of the directional coupler a capacitance of 1 nF was connected in parallel. In the simulated measurement, this leads to the frequency-dependent reflection coefficients $\Gamma_3 = \Gamma_4 \neq 0$.

Figure 6B:
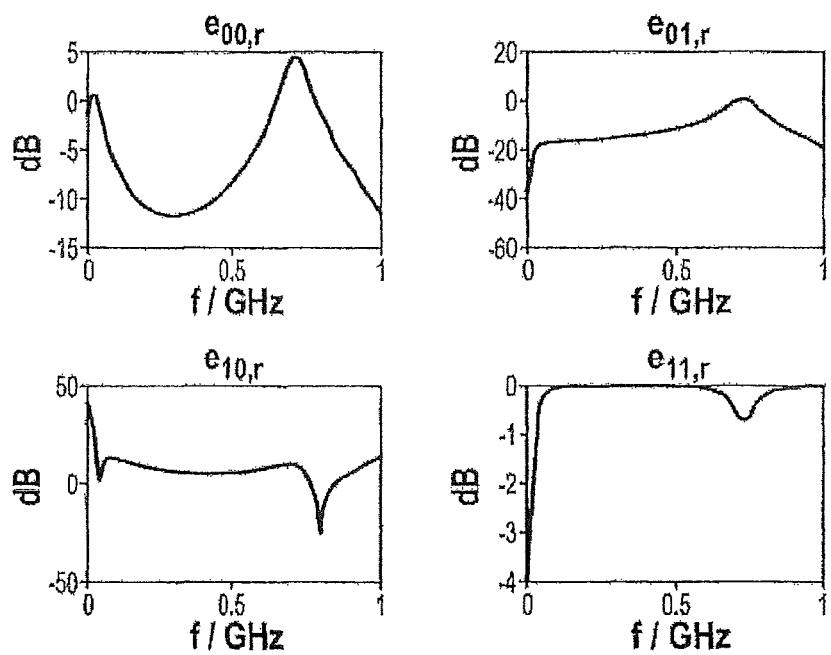
FIG. 6b shows a graphic representation of the calibration parameters $e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$ for the exemplary setup shown in FIG. 5, in relation to the frequency f, using exemplary reflection coefficients $\Gamma_3$, $\Gamma_4$ of the measuring inputs of the time domain measuring device.

In order firstly to show the correct determination of the scattering parameters $S_{xy}$ by means of the equations (13) to (16), the scattering parameters are determined in a separate simulation, in which the calibration plane is replaced by a port S2. FIG. 5 shows the perfect correspondence between this reference and the 16 scattering parameters of the four-port determined according to the equations. The scattering parameters can therefore now be used to determine a corrected matrix $E_r$, corrected by the mismatch, the entries of which are the calibration parameters $e_{xy,r}$, which are represented in FIG. 6b.

Figure 7A:
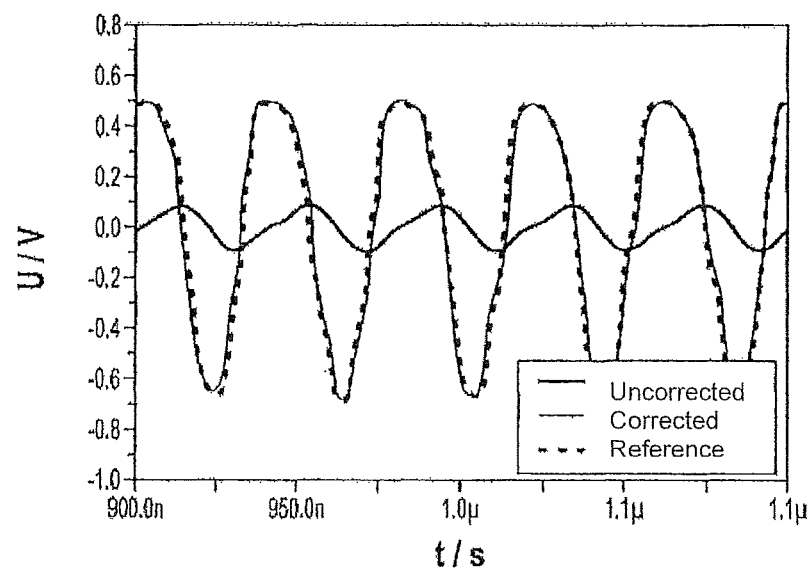
FIG. 7a shows a graphic representation of an electric voltage u(t) determined in the calibration plane with the method according to the invention using the (corrected) calibration parameters $e_{00,r}$, $e_{01,r}$, $e_{10,r}$, $e_{11,r}$ and using the (uncorrected) calibration parameters $e_{00}$, $e_{01}$, $e_{10}$, $e_{11}$ for an input first RF signal.
Figure 7B:
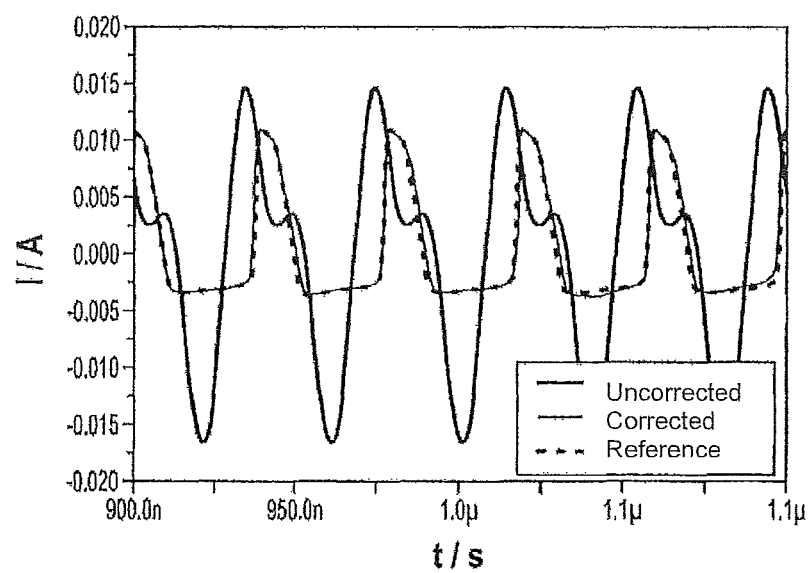
FIG. 7b shows a graphic representation of an electric current i(t) determined in the calibration plane with the method according to the invention using the (corrected) calibration parameters $e_{00,r}$, $e_{01,r}$, $e_{10,r}$, $e_{11,r}$ and using the (uncorrected) calibration parameters $e_{00}$, $e_{01}$, $e_{10}$, $e_{11}$ for an input first RF signal.

FIGS. 7a and 7b show the voltage u(t) and the current i(t) in the calibration plane. It can be seen that where the calibration parameters $e_{xy}$ which are not corrected by the mismatch are used, as shown in FIG. 6a, neither the amplitude nor the form of the curves are correctly reproduced. In contrast, both the voltage and the current are consistent with the reference determined through simulation if the corrected calibration parameters $e_{xy,r}$ corrected by means of the method according to the invention are used (see FIG. 6b). It could thus be verified that, with corresponding correction through the method according to the invention, a time domain measuring device with measuring inputs with reflection-free termination need not necessarily be used, and that reflection coefficients $\Gamma_3 \neq 0$ and/or $\Gamma_4 \neq 0$ can be corrected.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method for determining an electric voltage u(t) and/or an electric current i(t) of a RF signal on an electric cable in a calibration plane that compensates for distortions based on input signal reflections, said method comprising:

electrically connecting a time domain measuring device to a device under test, said time domain measuring device having measuring inputs which distort parameters to be measured as a result of input signal reflections;

connecting the device under test electrically with the calibration plane;

electrically connecting a directional coupler to the time domain measuring device;

decoupling a first component $v_3(t)$ of a first RF signal which, starting out from a signal input, runs in the direction of the calibration plane through the directional coupler feeding said first component into the time domain measuring device at a first measuring input and measured there;

decoupling a second component $v_4(t)$ of a second RF signal which, starting out from the calibration plane, runs in the direction of the signal input through the directional coupler;

feeding said second component into the time domain measuring device at a second measuring input and measured there;

transforming the signal components $v_3(t)$, $v_4(t)$, by a first mathematical operation, into the frequency domain as wave quantities $V_3(f)$ and $V_4$;

determining absolute wave quantities $a_2$ and $b_2$ in the frequency domain in the calibration plane from the wave quantities $V_3(f)$ and $V_4(f)$ using calibration parameters ($e_{00,r}$, $e_{01,r}$, $e_{10,r}$, $e_{11,r}$);

converting absolute wave quantities $a_2$ and $b_2$, by a second mathematical operation, into the electric voltage u(t) and/or the electric current i(t) of the RF signal in the time domain in the calibration plane;

wherein the calibration parameters link the wave quantities $V_3(f)$ and $V_4(f)$ mathematically with the absolute wave quantities $a_2$ and $b_2$ in the calibration plane, wherein the first measuring input of the time domain measuring device has a reflection coefficient $\Gamma_3 \neq 0$ and/or the second measuring input of the time domain measuring device has a reflection coefficient $\Gamma_4 \neq 0$, determining the calibration parameters ($e_{00,r}$, $e_{01,r}$, $e_{10,r}$, $e_{11,r}$ are determined, with the aid of a calibration device, in relation to the frequency f and in relation to a reflection coefficient of at least one of the measuring inputs of the time domain measuring device; and determining the wave quantities $a_2$ and $b_2$ in the measuring step from the wave quantities $V_3(f)$ and $V_4(f)$ using the calibration parameters ($e_{00,r}(\Gamma_3, \Gamma_4)$, $e_{01,r}(\Gamma_3, \Gamma_4)$, $e_{10,r}(\Gamma_3, \Gamma_4)$, $e_{11,r}(\Gamma_3, \Gamma_4)$);

connecting the signal input of the directional coupler during the calibration step with a first measuring port S1;

connecting the first measuring output of the directional coupler with a second measuring port S3;

connecting the second measuring output of the directional coupler with a third measuring port S4 of the calibration device; and connecting one or more measuring standards with known reflection coefficients to a signal output of the directional coupler connected with the calibration plane S2;

wherein the calibration parameters ($e_{00,r}$, $e_{01,r}$, $e_{10,r}$, $e_{11,r}$) link the wave quantity $b_3$ running in at the second measuring port S3 and the wave quantity $b_4$ running in at the third measuring port S4 with the wave quantities $b_2$, $a_2$ running in and out in the calibration plane (14, S2) as follows:

$$\begin{pmatrix} b_4 \\ b_2 \end{pmatrix} = \begin{pmatrix} e_{00,r} & e_{01,r} \\ e_{10,r} & e_{11,r} \end{pmatrix} \begin{pmatrix} b_3 \\ a_2 \end{pmatrix}$$

wherein the scattering parameters $S_{xy}$ (x=1-4, y=1-4) of the scattering matrix S of the four-port with the ports S1, S2, S3, S4, in particular of the directional coupler together with input cables, are determined with the aid of the calibration apparatus, wherein the calibration parameters $e_{00,r}$, $e_{01,r}$, $e_{10,r}$, $e_{11,r}$ in relation to the reflection coefficients of the time domain measuring device $\Gamma_3$ $\Gamma_4$ are determined from the scattering parameters $S_{xy}$, wherein the calibration parameters are determined from the scattering parameters as follows:

$$e_{00,r} = \frac{S_{41} - \Gamma_3 S_{33} S_{41} + \Gamma_3 S_{31} S_{43}}{S_{31} + \Gamma_4 S_{34} S_{41} - \Gamma_4 S_{31} S_{44}},$$

$$e_{01,r} = \frac{S_{31} S_{42} - S_{32} S_{41}}{S_{31} + \Gamma_4 S_{34} S_{41} - \Gamma_4 S_{31} S_{44}},$$

$$e_{10,r} = \frac{\Gamma_4 S_{24} S_{41} + \Gamma_3 (\Gamma_4 S_{24}(S_{31} S_{43} - S_{33} S_{41}) + S_{23}(S_{31} + \Gamma_4 S_{34} S_{41} - \Gamma_4 S_{31} S_{44}))}{S_{31} + \Gamma_4 S_{34} S_{41} - \Gamma_4 S_{31} S_{44}} + \frac{S_{21}(1 - \Gamma_4 S_{44} - \Gamma_3(S_{33} + \Gamma_4 S_{34} S_{43} - \Gamma_4 S_{33} S_{44}))}{S_{31} + \Gamma_4 S_{34} S_{41} - \Gamma_4 S_{31} S_{44}},$$

$$e_{11,r} = \frac{\Gamma_4 S_{24}(-S_{32} S_{41} + S_{31} S_{42}) + S_{22}(S_{31} + \Gamma_4 S_{34} S_{41} - \Gamma_4 S_{31} S_{44}) - S_{21}(S_{32} + \Gamma_4 S_{34} S_{42} - \Gamma_4 S_{32} S_{44})}{S_{31} + \Gamma_4 S_{34} S_{41} - \Gamma_4 S_{31} S_{44}}$$

wherein the scattering parameters $S_{xy}$ are determined through measurement of the values $b_1/a_1$, $b_3/a_3$, $b_4/a_4$, $b_3/a_1$ or $b_1/a_3$, $b_4/a_1$ or $b_1/a_4$, $b_4/a_3$ or $b_3/a_4$ at the measuring ports S1, S3, S4 of the calibration device, wherein in each case preferably the measuring standards Match (M), Open (O), Short (S) with the known reflection coefficients $\Gamma_M$, $\Gamma_O$, $\Gamma_S$ are connected as devices under test in the calibration plane S2, where $a_1$, $a_3$, $a_4$ are wave quantities running in at the respective measuring ports S1, S3, S4 and $b_1$, $b_3$, $b_4$ are wave quantities running out at the respective measuring ports S1, S3, S4, and wherein the scattering parameters $S_{xy}$ are determined by means of the following equations:

$$S_{11} = i_{00}$$
$$S_{21} = i_{10}$$
$$S_{12} = i_{01}$$
$$S_{22} = i_{11}$$
$$S_{13} = S_{31} = \tilde{S}_{31} - \frac{\Gamma_{DUT} i_{10}}{1 - \Gamma_{DUT} i_{11}} S_{32},$$
$$S_{14} = S_{41} = \tilde{S}_{41} - \frac{\Gamma_{DUT} i_{10}}{1 - \Gamma_{DUT} i_{11}} S_{42}.$$
$$S_{23} = S_{32} = \frac{-(e_{11} - i_{11})(\Gamma_{DUT} i_{11} - 1)\tilde{S}_{31}}{(e_{11}\Gamma_{DUT} - 1)i_{10}},$$
$$S_{24} = S_{42} = \frac{(\Gamma_{DUT} i_{11} - 1)(e_{10} i_{10} + (i_{11} - e_{11})\tilde{S}_{41})}{(e_{11}\Gamma_{DUT} - 1)i_{10}},$$
$$S_{33} = \tilde{S}_{33} - \frac{\Gamma_{DUT} S_{23}}{1 - \Gamma_{DUT} i_{11}} \cdot S_{32}.$$
$$S_{43} = S_{34} = \tilde{S}_{34} - \frac{\Gamma_{DUT} S_{24}}{1 - \Gamma_{DUT} i_{11}} \cdot S_{32}.$$
$$S_{44} = \tilde{S}_{44} - \frac{\Gamma_{DUT} S_{24}}{1 - \Gamma_{DUT} i_{11}} \cdot S_{42},$$

where:

$\Gamma_{DUT}$ is the known reflection coefficient of the calibration standard used during the measurement:

$\widetilde{S_{xy}}$ are the $b_x/a_y$ measurable at the measuring ports S1, S3, S4; and $$i_{00} = \tilde{S}_{11,M},$$

$$e_{00} = \frac{\tilde{S}_{41,M}}{\tilde{S}_{31,M}},$$

$$i_{10} i_{01} = \frac{(\Gamma_O - \Gamma_S)(\tilde{S}_{11,O} - \tilde{S}_{11,M})(\tilde{S}_{11,S} - \tilde{S}_{11,M})}{\Gamma_O \Gamma_S (\tilde{S}_{11,O} - \tilde{S}_{11,S})},$$

$$e_{10} e_{01} = \frac{(\Gamma_O - \Gamma_S)\left(\frac{\tilde{S}_{41,O}}{\tilde{S}_{31,O}} - \frac{\tilde{S}_{41,M}}{\tilde{S}_{31,M}}\right)\left(\frac{\tilde{S}_{41,S}}{\tilde{S}_{31,S}} - \frac{\tilde{S}_{41,M}}{\tilde{S}_{31,M}}\right)}{\Gamma_O \Gamma_S \left(\frac{\tilde{S}_{41,O}}{\tilde{S}_{31,O}} - \frac{\tilde{S}_{41,S}}{\tilde{S}_{31,S}}\right)},$$

$$i_{11} = \frac{\Gamma_S(\tilde{S}_{11,O} - \tilde{S}_{11,M}) - \Gamma_O(\tilde{S}_{11,S} - \tilde{S}_{11,M})}{\Gamma_O \Gamma_S (\tilde{S}_{11,O} - \tilde{S}_{11,S})},$$

$$e_{11} = \frac{\Gamma_S \left(\frac{\tilde{S}_{41,O}}{\tilde{S}_{31,O}} - \frac{\tilde{S}_{41,M}}{\tilde{S}_{31,M}}\right) - \Gamma_O \left(\frac{\tilde{S}_{41,S}}{\tilde{S}_{31,S}} - \frac{\tilde{S}_{41,M}}{\tilde{S}_{31,M}}\right)}{\Gamma_O \Gamma_S \left(\frac{\tilde{S}_{41,O}}{\tilde{S}_{31,O}} - \frac{\tilde{S}_{41,S}}{\tilde{S}_{31,M}}\right)},$$

where $\Gamma_O$, $\Gamma_S$, $\Gamma_M$ are known reflection coefficients of the calibration standards Open (O), Short (S) and Match (M), and $\widetilde{S_{xy,K}}$ are the $b_x/a_y$ measurable at the measuring ports with connected calibration standard K.

2. The method of claim 1, wherein the signal components $v_3(t)$ and/or $v_4(t)$ are an electric voltage.

3. The method of claim 1 including using an oscilloscope as the time domain measuring device.

4. The method of claim 1 wherein the first mathematical operation is an FFT (Fast Fourier Transform) and/or the second mathematical operation is an inverse FFT (IFFT—Inverse Fast Fourier Transform).

5. The method of claim 1 wherein a vectorial network analyser (VNA) with at least three measuring ports is used as the calibration device.

6. The method of claim 1, wherein during the measuring step, in order to measure the time-variable signal components u(t) and i(t), the first measuring output of the directional coupler and the second measuring output of the directional coupler are isolated from the calibration device and connected with the measuring inputs of the time domain measuring device, while the first RF signal is fed via the signal input of the directional coupler.

* * * * *

UNITED STATES PATENT AND TRADEMARK OFFICE
CERTIFICATE OF CORRECTION

PATENT NO. : 10,191,092 B2  
APPLICATION NO. : 15/116428  
DATED : January 29, 2019  
INVENTOR(S) : Zietz Page 1 of 2

It is certified that error appears in the above-identified patent and that said Letters Patent is hereby corrected as shown below:

On the Title Page

Item (54) and in the Specification, Column 1, Line 1, in the Title: Delete "TIME DOMAIN MEASURING METHOD WITH CALIBRATION IN THE FREQUENCY RANGE" and substitute therefore -- TIME DOMAIN MEASURING METHOD WITH CALIBRATION IN THE FREQUENCY DOMAIN --

In the Specification

Column 13, Line 38, delete "NWA" and substitute therefore -- VNA --

Column 6, Line 27, delete " $S_{33} = \tilde{S}_{33} - \frac{\Gamma_{DUT} S_{23}}{1-\Gamma_{DUT} i_{111}} \cdot S_{32}$ "

And replace with $S_{33} = \tilde{S}_{33} - \frac{\Gamma_{DUT} S_{23}}{1-\Gamma_{DUT} i_{11}} \cdot S_{32}$ Column 10, Line 50, delete " $e_{10}e_{01} = \frac{(\Gamma_o - \Gamma_s)\left(\frac{\tilde{S}_{41,O}}{\tilde{S}_{31,O}} - \frac{\tilde{S}_{41,M}}{\tilde{S}_{31,M}}\right)\left(\frac{\tilde{S}_{41,S}}{\tilde{S}_{31,S}} - \frac{\tilde{S}_{41,M}}{\tilde{S}_{21,M}}\right)}{\Gamma_o \Gamma_s \left(\frac{\tilde{S}_{41,O}}{\tilde{S}_{31,O}} - \frac{\tilde{S}_{41,S}}{\tilde{S}_{31,S}}\right)}$ "

And replace with $e_{10}e_{01} = \frac{(\Gamma_o - \Gamma_s)\left(\frac{\tilde{S}_{41,O}}{\tilde{S}_{31,O}} - \frac{\tilde{S}_{41,M}}{\tilde{S}_{31,M}}\right)\left(\frac{\tilde{S}_{41,S}}{\tilde{S}_{31,S}} - \frac{\tilde{S}_{41,M}}{\tilde{S}_{31,M}}\right)}{\Gamma_o \Gamma_s \left(\frac{\tilde{S}_{41,O}}{\tilde{S}_{31,O}} - \frac{\tilde{S}_{41,S}}{\tilde{S}_{31,S}}\right)}$ Column 20, Lines 47-52, delete "
$$\{u(k \cdot \Delta f)\} = IFFT\{V_2(l \cdot \Delta f)\}, \quad (23)$$
$$\{i(k \cdot \Delta f)\} = IFFT\{I_2(l \cdot \Delta f)\} \quad (24)$$
$$where\ k = 0,1,\ldots,N-1$$
$$and\ l = 0,1,\ldots,\frac{N-1}{2}.$$
"

Signed and Sealed this  
Twenty-fifth Day of June, 2019

Andrei Iancu  
*Director of the United States Patent and Trademark Office*

CERTIFICATE OF CORRECTION (continued)
U.S. Pat. No. 10,191,092 B2

And replace with
$$\{u(k \cdot \Delta t)\} = IFFT\{V_2(l \cdot \Delta f)\}, \quad (23)$$
$$\{i(k \cdot \Delta t)\} = IFFT\{I_2(l \cdot \Delta f)\} \quad (24)$$
$$where\ k = 0, 1, \ldots, N-1$$
$$and\ l = 0, 1, \ldots, \frac{N-1}{2}.$$

In the Claims

Claim 1, Column 22, Line 10, after "V₄" insert -- (f) --

Claim 1, Column 22, Line 27, after "e₁₁,ᵣ)" delete "are determined"

Claim 1, Column 23, Lines 45-46, delete "
$$s_{24} = s_{42} = \frac{(\Gamma_{DUT} i_{11} - 1)(e_{10} i_{10} + (i_{11} - e_{11})\tilde{S}_{41})}{(e_{11}\Gamma_{DUT} - 1)i_{10}}$$
"

And replace with
$$s_{24} = s_{42} = \frac{(\Gamma_{DUT} i_{11} - 1)(e_{01} i_{10} + (i_{11} - e_{11})\tilde{S}_{41})}{(e_{11}\Gamma_{DUT} - 1)i_{10}}$$

Claim 1, Column 24, Lines 25-30, delete "
$$e_{11} = \frac{\Gamma_s \left(\frac{\tilde{S}_{41,0}}{\tilde{S}_{31,0}} - \frac{\tilde{S}_{41,M}}{\tilde{S}_{31,M}}\right)\Gamma_o \left(\frac{\tilde{S}_{41,S}}{\tilde{S}_{31,S}} - \frac{\tilde{S}_{41,M}}{\tilde{S}_{31,M}}\right)}{\Gamma_o \Gamma_s \left(\frac{\tilde{S}_{41,0}}{\tilde{S}_{31,0}} - \frac{\tilde{S}_{41,S}}{\tilde{S}_{31,M}}\right)}$$
"

And replace with
$$e_{11} = \frac{\Gamma_s \left(\frac{\tilde{S}_{41,0}}{\tilde{S}_{31,0}} - \frac{\tilde{S}_{41,M}}{\tilde{S}_{31,M}}\right)\Gamma_o \left(\frac{\tilde{S}_{41,S}}{\tilde{S}_{31,S}} - \frac{\tilde{S}_{41,M}}{\tilde{S}_{31,M}}\right)}{\Gamma_o \Gamma_s \left(\frac{\tilde{S}_{41,0}}{\tilde{S}_{31,0}} - \frac{\tilde{S}_{41,S}}{\tilde{S}_{31,S}}\right)}$$